(12) United States Patent
Kim

(10) Patent No.: US 10,685,877 B2
(45) Date of Patent: Jun. 16, 2020

(54) SEMICONDUCTOR DEVICES INCLUDING A SUPPORT STRUCTURE TO CONNECT TO AND SUPPORT ELECTRODES

(71) Applicant: Samsung Electronics Co., Ltd., Suwon-si, Gyeonggi-do (KR)

(72) Inventor: Ji-hoon Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/664,321

(22) Filed: Jul. 31, 2017

(65) Prior Publication Data
US 2018/0166320 A1     Jun. 14, 2018

(30) Foreign Application Priority Data
Dec. 14, 2016  (KR) .................. 10-2016-0170413

(51) Int. Cl.
*H01L 21/768* (2006.01)
*H01L 27/108* (2006.01)
*H01L 49/02* (2006.01)

(52) U.S. Cl.
CPC .... *H01L 21/7687* (2013.01); *H01L 27/10808* (2013.01); *H01L 27/10852* (2013.01); *H01L 28/90* (2013.01); *H01L 27/10814* (2013.01)

(58) Field of Classification Search
CPC ........... H01L 21/7687; H01L 21/28008; H01L 21/76816; H01L 27/10852; H01L 27/10808; H01L 27/10814; H01L 27/108; H01L 27/10823; H01L 28/40; H01L 28/60; H01L 28/90; H01L 27/10805

See application file for complete search history.

(56) References Cited

U.S. PATENT DOCUMENTS

| | | | |
|---|---|---|---|
| 7,727,837 B2 | 6/2010 | Gruening-von Schwerin et al. | |
| 7,858,486 B2 * | 12/2010 | Manning | H01L 27/0805 257/E21.396 |
| 7,977,724 B2 * | 7/2011 | Park | H01L 28/91 257/301 |
| 7,989,287 B2 | 8/2011 | Eun | |
| 8,395,235 B2 | 3/2013 | Tsuchiya | |
| 8,921,977 B2 * | 12/2014 | Huang | H01L 27/10817 257/296 |
| 9,147,685 B2 * | 9/2015 | Byun | H01L 27/10808 |
| 9,240,441 B2 | 1/2016 | Yoon et al. | |
| 9,287,349 B2 | 3/2016 | Kim et al. | |

(Continued)

*Primary Examiner* — Khiem D Nguyen
(74) *Attorney, Agent, or Firm* — Harness, Dickey & Pierce, P.L.C.

(57) ABSTRACT

A semiconductor device includes: a plurality of lower electrodes arranged on a substrate in a first direction, which is parallel to a main surface of the substrate, and a second direction parallel to the main surface of the substrate and perpendicular to the first direction; and a support structure pattern configured to connect the plurality of lower electrodes to each other to support the plurality of lower electrodes, on the substrate and including a plurality of open portions. The plurality of open portions have shapes extending longer in the second direction than in the first direction, and when viewed from inner sides of the plurality of open portions, the plurality of open portions are convex in the first direction and are concave in the second direction.

18 Claims, 24 Drawing Sheets

(56) References Cited

U.S. PATENT DOCUMENTS

| | | | |
|---|---|---|---|
| 2009/0014833 A1* | 1/2009 | Yoon | H01L 27/10852 |
| | | | 257/532 |
| 2010/0012989 A1* | 1/2010 | Lee | H01L 21/31111 |
| | | | 257/288 |
| 2010/0279485 A1* | 11/2010 | Ishikawa | H01L 27/10852 |
| | | | 438/396 |
| 2010/0314715 A1* | 12/2010 | Fujimoto | H01L 27/0207 |
| | | | 257/532 |
| 2011/0062552 A1* | 3/2011 | Tsuchiya | H01L 27/10814 |
| | | | 257/532 |
| 2012/0115300 A1* | 5/2012 | Hirota | H01L 27/10817 |
| | | | 438/381 |
| 2012/0161283 A1* | 6/2012 | Kadoya | H01L 27/10814 |
| | | | 257/532 |
| 2013/0147048 A1* | 6/2013 | Kuh | H01L 23/49827 |
| | | | 257/768 |
| 2013/0230961 A1* | 9/2013 | Kim | H01L 28/60 |
| | | | 438/381 |
| 2014/0065785 A1* | 3/2014 | Yoon | H01L 28/40 |
| | | | 438/381 |
| 2015/0091069 A1* | 4/2015 | Oh | H01L 27/1085 |
| | | | 257/300 |
| 2016/0043089 A1 | 2/2016 | Song et al. | |
| 2018/0019243 A1* | 1/2018 | Kim | H01L 27/10808 |

* cited by examiner

SEMICONDUCTOR DEVICES INCLUDING A SUPPORT STRUCTURE TO CONNECT TO AND SUPPORT ELECTRODES

CROSS-REFERENCE TO RELATED APPLICATION

This application claims the benefit of Korean Patent Application No. 10-2016-0170413, filed on Dec. 14, 2016, in the Korean Intellectual Property Office, the disclosure of which is incorporated herein in its entirety by reference.

BACKGROUND

Example embodiments of the inventive concepts relate to a semiconductor device. For example, at least some example embodiments relate to a semiconductor device including a support structure pattern that reduces a probability of (or, alternatively, prevents) lower electrodes of a capacitor from collapsing.

Recently, as the integration of memory products has been accelerated due to the rapid development of miniaturized semiconductor process technology, an area of a unit cell has been significantly reduced. For example, as the level of integration of semiconductor devices such as dynamic random access memory (DRAM) has increased, areas occupied by devices have decreased, and thus an aspect ratio of lower electrodes of a capacitor has greatly increased. As a result, lower electrodes may collapse or break before a dielectric layer is formed.

SUMMARY

At least some example embodiments of the inventive concepts provide a semiconductor device including a support structure pattern that may reduce a probability of (or, alternatively, prevent) lower electrodes of a capacitor from collapsing and is used to easily form a dielectric layer and an upper electrode.

According to an example embodiment of the inventive concepts, a semiconductor device may include a plurality of lower electrodes arranged on a substrate in a first direction and a second direction, the first direction being parallel to a main surface of the substrate, and the second direction being parallel to the main surface of the substrate and perpendicular to the first direction; and a support structure pattern configured to connect the plurality of lower electrodes to each other, and to support the plurality of lower electrodes on the substrate, the support structure pattern having a plurality of open portions therein, the plurality of open portions having a shape that extends further in the second direction than in the first direction, and the plurality of open portions are convex in the first direction and are concave in the second direction when viewed from inner sides of the plurality of open portions.

According to another example embodiment of the inventive concepts, a semiconductor device may include a plurality of lower electrodes arranged on a substrate in a first direction and a second direction, the first direction being parallel to a main surface of the substrate, and the second direction being parallel to the main surface of the substrate and crossing the first direction, and the plurality of lower electrodes including a plurality of first lower electrodes and a plurality of second lower electrodes; and a support structure pattern configured to connect the plurality of lower electrodes to each other, and to support the plurality of lower electrodes on the substrate, the support structure pattern having a plurality of open portions therein, each of the plurality of open portions exposing two of the plurality of first lower electrodes and exposing two of the plurality of second lower electrodes, wherein areas of a cross-sections of the plurality of first lower electrodes are smaller than areas of a cross-sections of the plurality of second lower electrodes.

According to another example embodiment of the inventive concepts, a semiconductor device may include a support structure pattern configured to support a plurality of lower electrodes on a substrate, the support structure pattern including a first support structure pattern and a second support structure pattern with the plurality of lower electrodes therebetween, the first support structure pattern and the second support structure pattern having a plurality of first openings and a plurality of second openings therein, respectively, the plurality of first openings being aligned with the plurality of second openings such that respective ones of the plurality of first openings and respective ones of the plurality of second openings extend in a direction perpendicular to the substrate between four of the plurality of lower electrodes, wherein the first support structure pattern is at a lower level than the second support structure pattern with respect to the substrate, and a cross-section area of each of the plurality of first openings is smaller than a cross-section area of each of the plurality of second openings.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
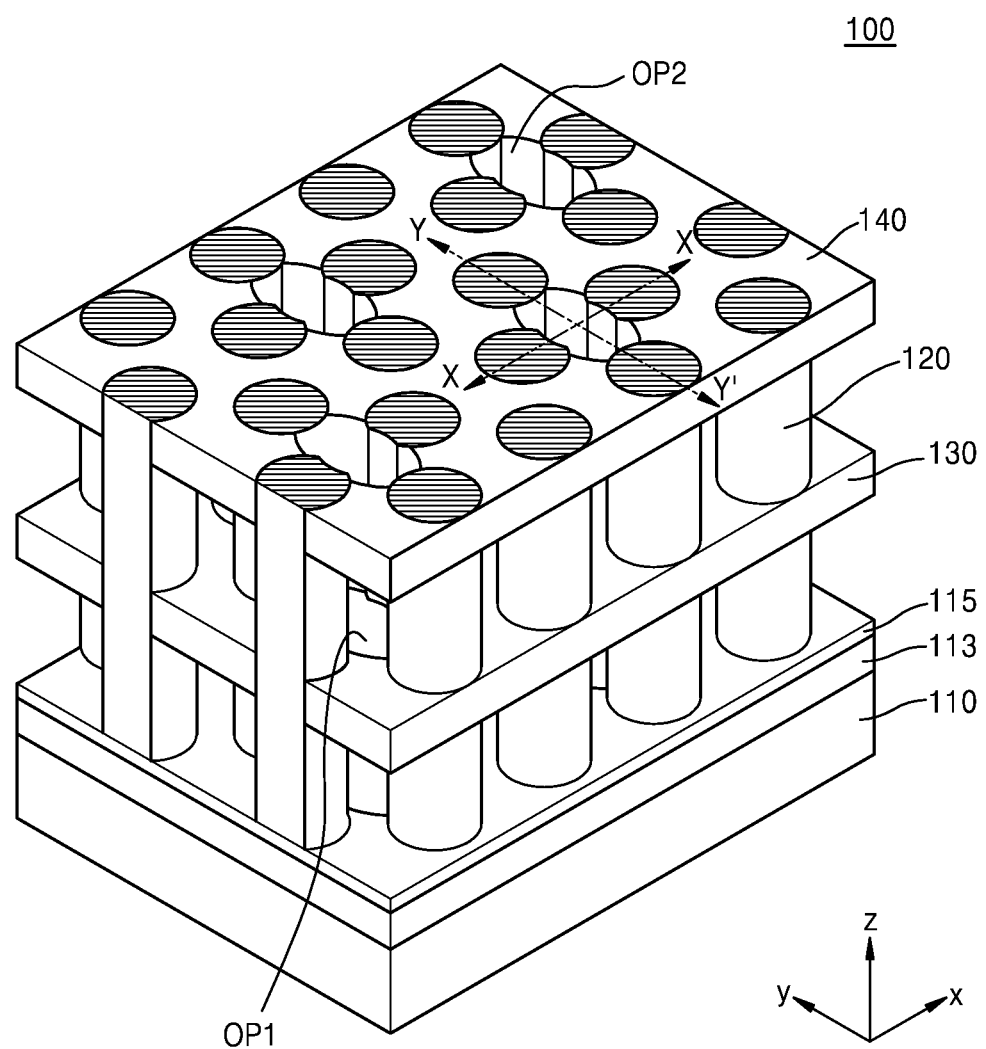
FIG. 1A is a schematic perspective view of a semiconductor device according to an example embodiment.
Figure 1B:
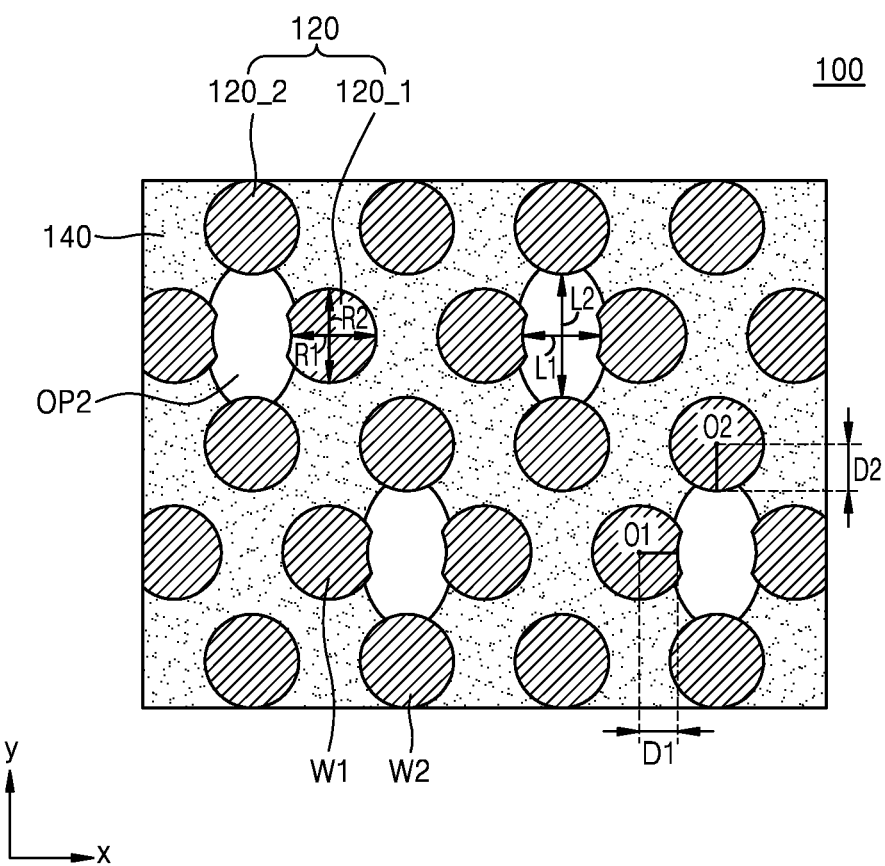
FIG. 1B is a plan view for explaining a second support structure pattern of a semiconductor device, according to an example embodiment.
Figure 1C:
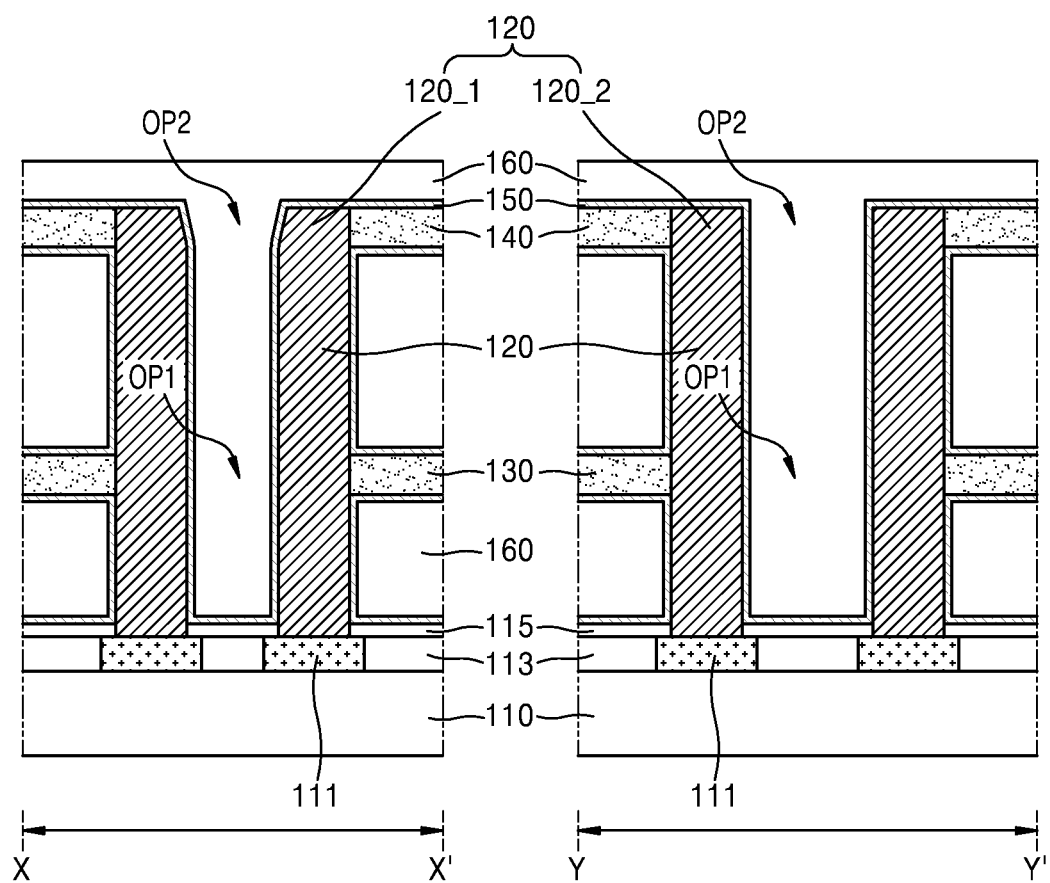
FIG. 1C is a cross-sectional view of a semiconductor device according to an example embodiment, taken along a line X-X' and a line Y-Y' of FIG. 1A.

FIG. 1A is a schematic perspective view of a semiconductor device 100 according to an example embodiment. FIG. 1B is a plan view for explaining a second support structure pattern 140 of the semiconductor device 100, according to an example embodiment. FIG. 1C is a cross-sectional view of the semiconductor device 100 according to an example embodiment, taken along a line X-X' and a line Y-Y' of FIG. 1A. FIG. 1C is a cross-sectional view additionally showing a dielectric layer 150 and an upper electrode 160 which are not shown in FIG. 1A.

Referring to FIGS. 1A to 1C, the semiconductor device 100 may include a substrate 110, an interlayer insulating layer 113, an etch stop layer 115, a plurality of lower electrodes 120, a first support structure pattern 130, and the second support structure pattern 140. A dielectric layer 150 and an upper electrode 160 may be formed on the lower electrodes 120, the first support structure pattern 130, and the second support structure pattern 140.

The substrate 110 may include a semiconductor material, for example, silicon (Si), germanium (Ge), SiGe, or the like, and may further include an epitaxial layer, a Silicon On Insulator (SOI) layer, a Germanium On Insulator (GOI) layer, a Semiconductor On Insulator (SeOI) layer, or the like. The substrate 110 may include a semiconductor substrate and semiconductor devices. For example, the semiconductor device may include a metal oxide semiconductor (MOS) transistor, a diode, and a resistor. Gate lines and bit lines may be on the semiconductor substrate.

The interlayer insulating layer 113 may include a high density plasma (HDP) oxide layer, TetraEthyl OrthoSilicate (TEOS), Plasma Enhanced TetraEthyl OrthoSilicate (PE-TEOS), O3-TetraEthyl OrthoSilicate (OS-TEOS), Undoped Silicate Glass (USG), Phospho Silicate Glass (PSG), Borosilicate Glass (BSG), BoroPhosphoSilicate Glass (BPSG), Fluoride Silicate Glass (FSG), Spin On Glass (SOG), Tonen SilaZene (TOSZ), or a combination thereof. Also, the interlayer insulating layer 113 may include silicon nitride, silicon oxynitride, or a material having low permittivity, e.g., a material having lower permittivity than silicon oxide.

The etch stop layer 115 may include a material having etching selectivity to the interlayer insulating layer 113 that is flattened. For example, the etch stop layer 115 may include silicon nitride or silicon oxynitride.

The lower electrodes 120 may each include at least one of a metal material, metal nitride, and metal silicide. For example, the lower electrode 120 may include a refractory metal material such as cobalt (Co), titanium (Ti), nickel (Ni), tungsten (W), and molybdenum (Mo). As another example, the lower electrode 120 may include metal nitride such as titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), or tungsten nitride (WN). In addition, the lower electrode 120 may include a noble metal layer including a material selected from the group consisting of platinum (Pt), ruthenium (Ru), and iridium (Ir). The lower electrode 120 may include a noble metal conductive oxide layer.

On the substrate 110, the lower electrodes 120 may have thin and long shapes extending in a direction perpendicular to both a first direction (an x direction) and a second direction (a y direction) which are parallel to a main surface of the substrate 110. The lower electrodes 120 may be arranged along the first direction (the x direction) and the second direction (the y direction) to form multiple rows and columns. In this case, to secure spaces between the lower electrodes 120, the lower electrodes 120 on any one of the rows may be misaligned relative to the lower electrodes 120 on another adjacent row. As the lower electrodes 120 are misaligned relative to each other, a relatively large space between the lower electrodes 120 may be secured and may contribute to deposition of a dielectric material in subsequent processes such as a dielectric material deposition process.

In an example embodiment, the lower electrodes 120 may have honeycomb structures in which the lower electrodes 120 are arranged at vertices and a central point of a hexagon. Since the lower electrodes 120 are arranged in a honeycomb shape, the lower electrodes 120 are apart from each other at regular intervals, and thus a dielectric material and an upper electrode material are uniformly deposited during a subsequent process, thereby implementing a semiconductor device including a capacitor with uniform performance. In detail, the lower electrodes 120 may be arranged in a manner that six vertices of a hexagon respectively become central points of six adjacent hexagons and the central points are shared by the six adjacent hexagons.

The lower electrode 120 may have a pillar-type structure, and a cross-section of the lower electrode 120 may be circular or oval. However, example embodiments of the inventive concepts are not limited thereto. A cylinder-type structure of the lower electrode 120 will be described later with reference to FIGS. 2A to 2C, and a case where the lower electrodes 120 have pillar-type structures and cylinder-type structures will be described later with reference to FIG. 11.

In an example embodiment, the lower electrodes 120 may have aspect ratios that are height-to-width ratios and range from about 10 to about 35. When the aspect ratios of the lower electrodes 120 increase, the lower electrodes 120 may collapse or break. Accordingly, the semiconductor device 100 may further include the first support structure pattern 130 and the second support structure pattern 140 to reduce a probability of (or, alternatively, prevent) the lower electrodes 120 from collapsing. In this case, the first support structure pattern 130 and the second support structure pattern 140 may include nitride, but the material is not limited thereto. The semiconductor device 100 includes two first support structure patterns 130 and two second support structure patterns 140. However, example embodiments of the inventive concepts are not limited thereto. The semiconductor device 100 may include only the second support structure pattern 140, and depending on the aspect ratios of the lower electrodes 120, the semiconductor device 100 may further include a support structure pattern.

The first support structure pattern 130 may be of a one-body type including multiple first open portions OP1, and the second support structure pattern 140 may be of a one-body type including multiple second open portions OP2. That is, the first support structure pattern 130 and the second support structure pattern 140 may each have a structure in which an entire portion thereof is connected. The first support structure pattern 130 and the second support structure pattern 140 may have flat shapes that are parallel to the main surface of the substrate 110 at a certain height from the main surface of the substrate 110.

Figure 9A:
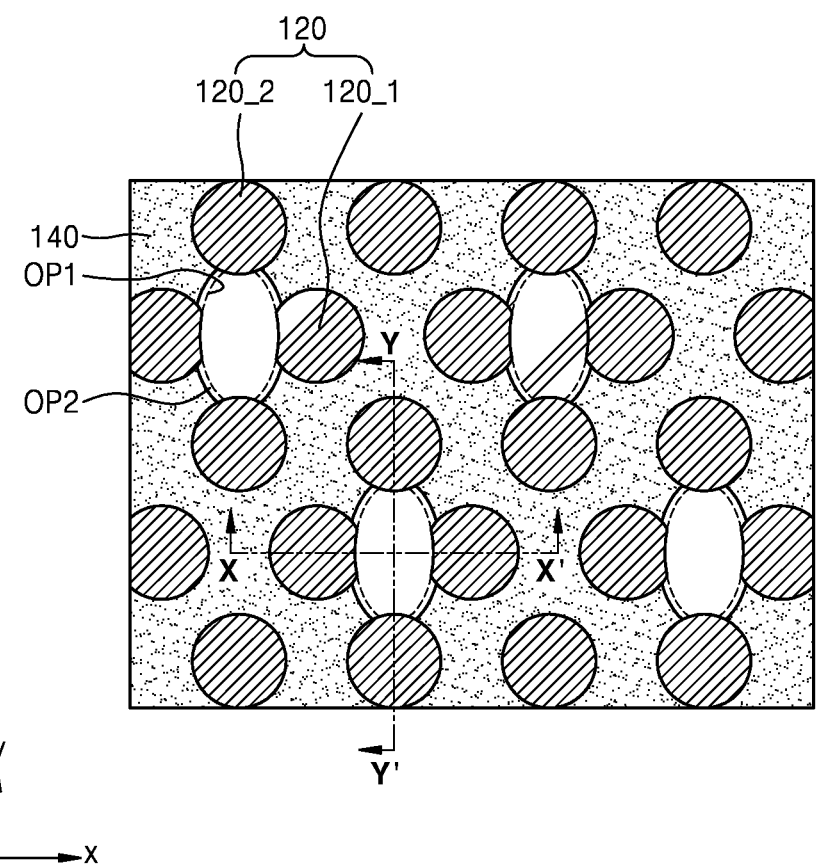
Figure 9B:
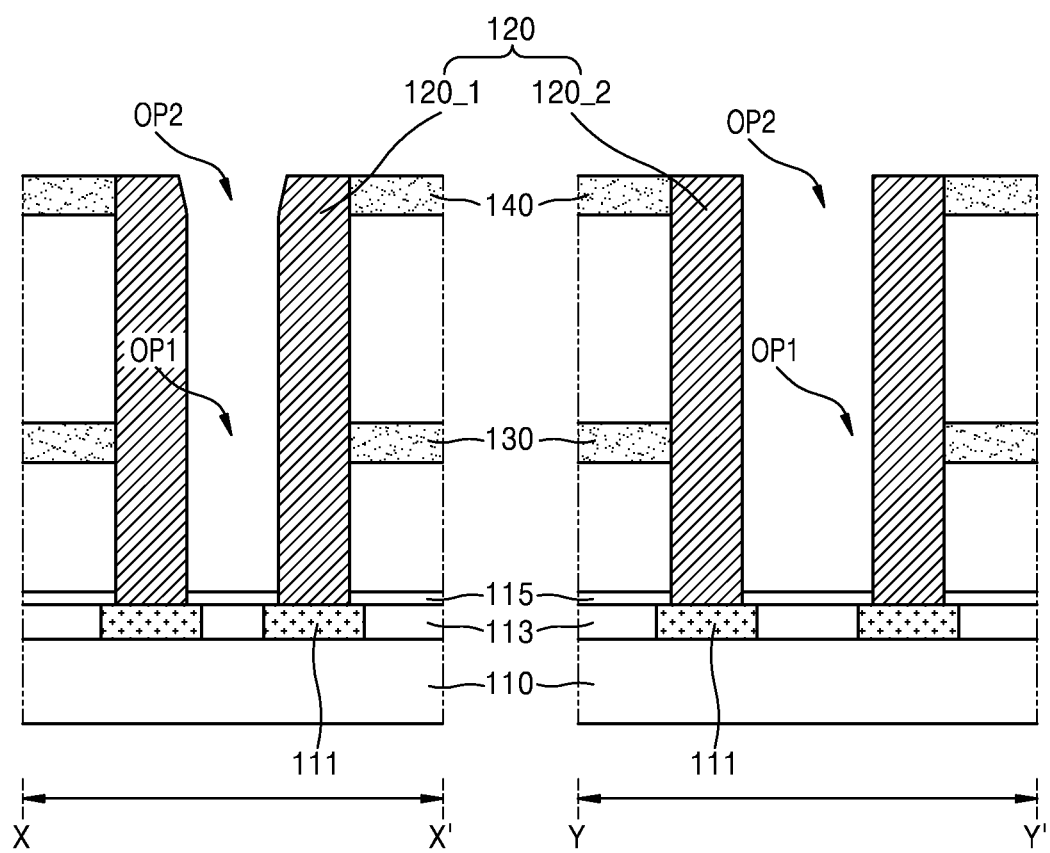
Figure 10A:
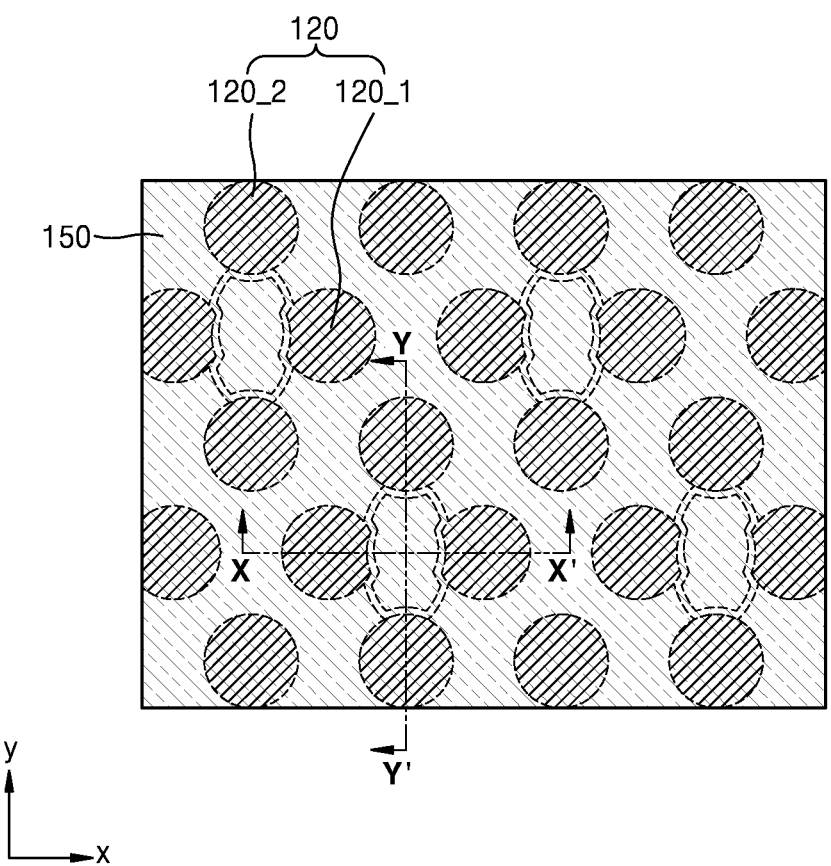
Figure 10B:
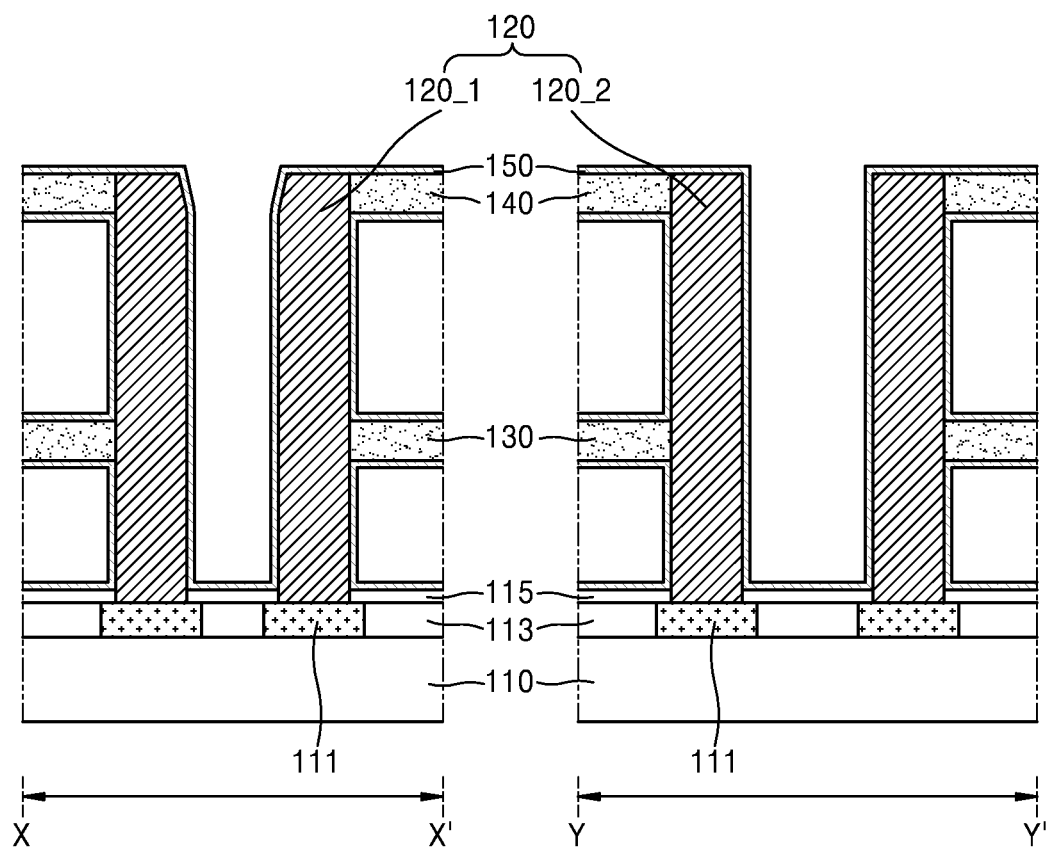

The first support structure pattern 130 may be at a lower level than the second support structure pattern 140 with respect to the main surface of the substrate 110. Thus, the first open portions OP1 and the second open portions OP2 may overlap each other in a direction perpendicular to the main surface of the substrate 110. In this case, a cross-section area of each first open portion OP1 may be smaller than that of each second open portion OP2. This will be described later with reference to FIGS. 9A and 9B.

The first open portions OP1 and the second open portions OP2 may be arranged along the first direction (the x direction) and the second direction (the y direction), respectively. According to necessity, the first open portions OP1 and the second open portions OP2 may be arranged according to a certain rule. For example, the first open portions OP1 and the second open portions OP2 may have honeycomb structures in which the first open portions OP1 and the second open portions OP2 are arranged at vertices and a central point of a hexagon, respectively, on the substrate 110.

The first open portions OP1 and the second open portions OP2 may have shapes long in the first direction (the x direction) and the second direction (the y direction), respectively. Thus, the first open portions OP1 and the second open portions OP2 may expose a plurality of first lower electrodes 120_1 in the first direction (the x direction) and second lower electrodes 120_2 in the second direction (the y direction). In an example embodiment, the first open portions OP1 and the second open portions OP2 may each expose portions of four electrodes 120, and accordingly, the first open portions OP1 or the second open portions OP2 may expose all of the lower electrodes 120.

The fact that the first open portions OP1 and the second open portions OP2 expose the lower electrodes 120 indicates the structures of the first support structure pattern 130 and the second support structure pattern 140 before deposition of the dielectric layer 150 and the upper electrode 160. After the dielectric layer 150 and the upper electrode 160 are formed, the lower electrodes 120 are covered by the dielectric layer 150 and the upper electrode 160, and thus the lower electrodes 120 may not be exposed by the first open portions OP1 and the second open portions OP2. Therefore, the first open portions OP1 and the second open portions OP2 may be understood as regions where the first support structure pattern 130 does not contact the second support structure pattern 140 at a level, at which the first support structure pattern 130 and the second support structure pattern 140 are formed, from the main surface of the substrate 110 and the dielectric layer 150 and the upper electrode 160 are formed.

Figure 6A:
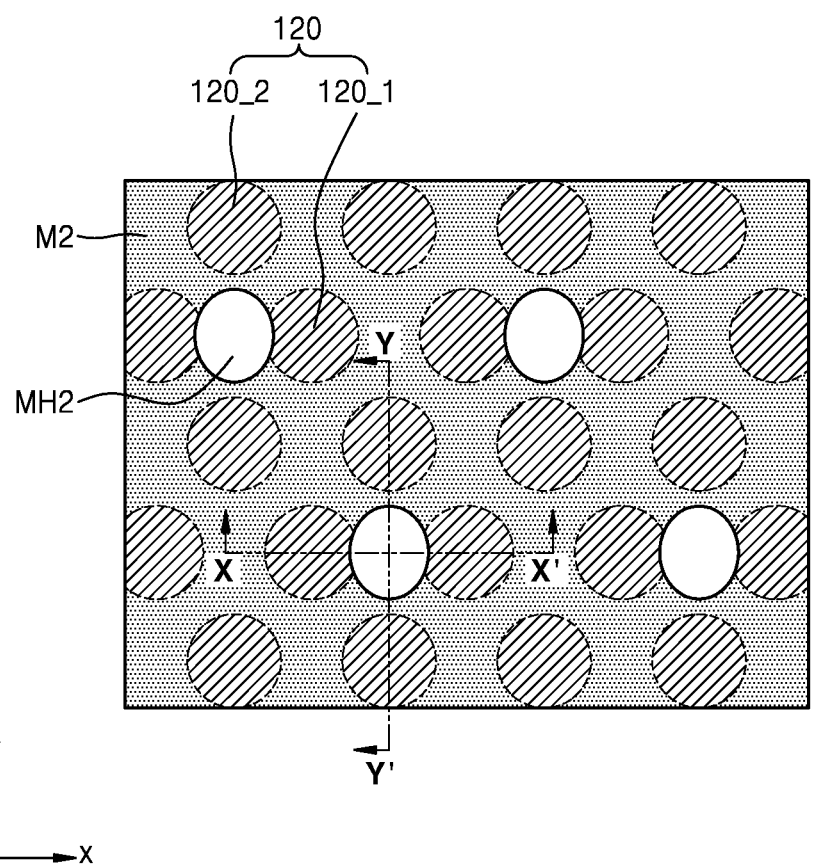

The lower electrodes 120 may include the first lower electrodes 120_1, which are arranged in the first direction (the x direction) with respect to the first open portions OP1 and the second open portions OP2, and the second lower electrodes 120_2, which are arranged in the second direction (the y direction) with respect to the first open portions OP1 and the second open portions OP2. In this case, the first lower electrodes 120_1 and the second lower electrodes 120_2 may have cross-sections having different shapes. The cross-sections of the first lower electrodes 120_1 and the second lower electrodes 120_2 denote cross-sections at the level at which the first support structure pattern 130 or the second support structure pattern 140 is formed. The difference between the cross-sections is made during the manufacture of a semiconductor device as described in detail with reference to FIGS. 6A to 6B.

Lengths L1 of the first open portions OP1 and the second open portions OP2 in the first direction (the x direction) may be less than lengths L2 thereof in the second direction (the y direction). When viewed from inner sides of the first open portions OP1 and the second open portions OP2, side surfaces of the first open portions OP1 and the second open portions OP2 in the first direction (the x direction), in which the first lower electrodes 120_1 are exposed, may be convex from central portions of the first open portions OP1 and the second open portions OP2, and side surfaces of the first open portions OP1 and the second open portions OP2 in the second direction (the y direction), in which the second lower electrodes 120_2 are exposed, may be concave from the central portions. Thus, a minimum distance D1 from a central portion O1 of the cross-section of the first lower electrode 120_1 to the first open portion OP1 or the second open portion OP2 may be less than a minimum distance D2 from a central portion O2 of the cross-section of the second lower electrode 120_2 to the first open portion OP1 or the second open portion OP2.

For example, the cross-sections of the second lower electrodes 120_2 are circular, but the cross-sections of the first lower electrodes 120_1 may have shapes having side portions that are partially removed. Thus, cross-section areas W1 of the first lower electrode 120_1 may be smaller than cross-section areas W2 of the second lower electrode 120_2. Also, widths R1 of the first lower electrodes 120_1 in the first direction (the x direction) may be less than widths R2 of the first lower electrodes 120_1 in the second direction (the y direction).

As the number of lower electrodes that are exposed by open portions formed in a support structure pattern is small, a time taken to perform subsequent processes increases and the subsequent processes may be non-uniformly performed. On the contrary, in the semiconductor device 100 according to an example embodiment, the number of lower electrodes 120 that are exposed by the open portions in the first support structure pattern 130 and the second support structure pattern 140, that is, exposed to the outside, increases, and thus subsequent processes such as a dielectric material deposition process and a conductive material deposition process for forming an upper electrode may be smoothly and uniformly performed.

The dielectric layer 150 may be, for example, any one layer selected from the group consisting of metal oxide such as $HfO_2$, $ZrO_2$, $Al_2O_3$, $La_2O_3$, $Ta_2O_3$, or $TiO_2$ and a dielectric material, e.g., $SrTiO_3$(STO), $BaTiO_3$, PZT, or PLZT, which has a Perovskite structure, or a combination thereof. The upper electrode 160 may include at least one of silicon doped with impurities, metal materials, metal nitride, and metal silicide. The upper electrode 160 may include the same material as the lower electrodes 120. However, the material of the upper electrode 160 is not limited thereto.

The semiconductor device 100 according to an example embodiment may reduce a probability of (or, alternatively, prevent) the lower electrodes 120 from collapsing in the subsequent processes due to the first support structure pattern 130 and the second support structure pattern 140. In addition, since the semiconductor device 100 according to an example embodiment includes the first support structure pattern 130 including the first open portions OP1 and the second support structure pattern 140 including the second open portions OP2, the number of lower electrodes 120 that are exposed by the first open portions OP1 and the second open portions OP2 may increase, and additionally, the first open portions OP1 and the second open portions OP2 in the semiconductor device 100 according to an example embodiment may expose all of the lower electrodes 120. Therefore, the subsequent processes may be smoothly performed, and the dielectric layer 150 and the upper electrode 160 are uniformly formed so that the performance of a capacitor and the semiconductor device 100 may be improved.

Figure 2A:
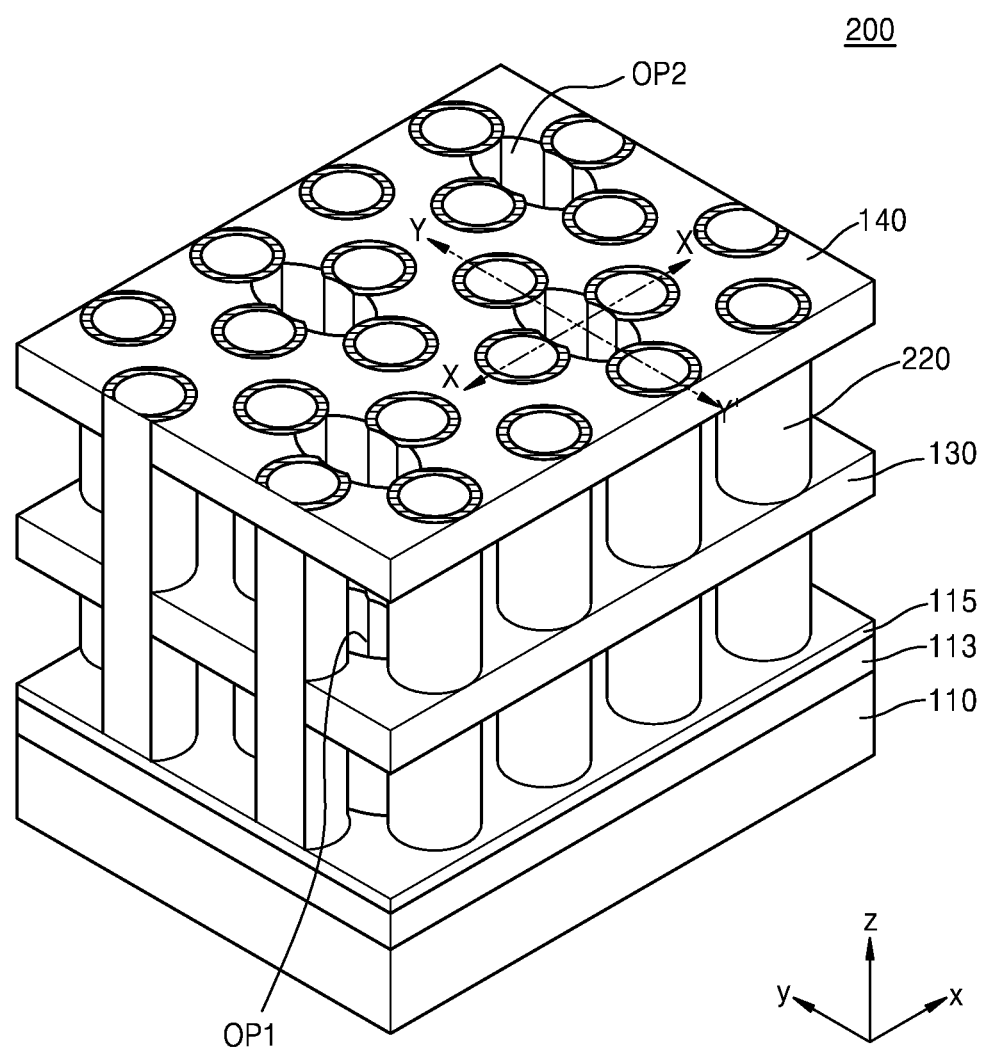
FIG. 2A is a schematic perspective view of a semiconductor device according to an example embodiment.
Figure 2B:
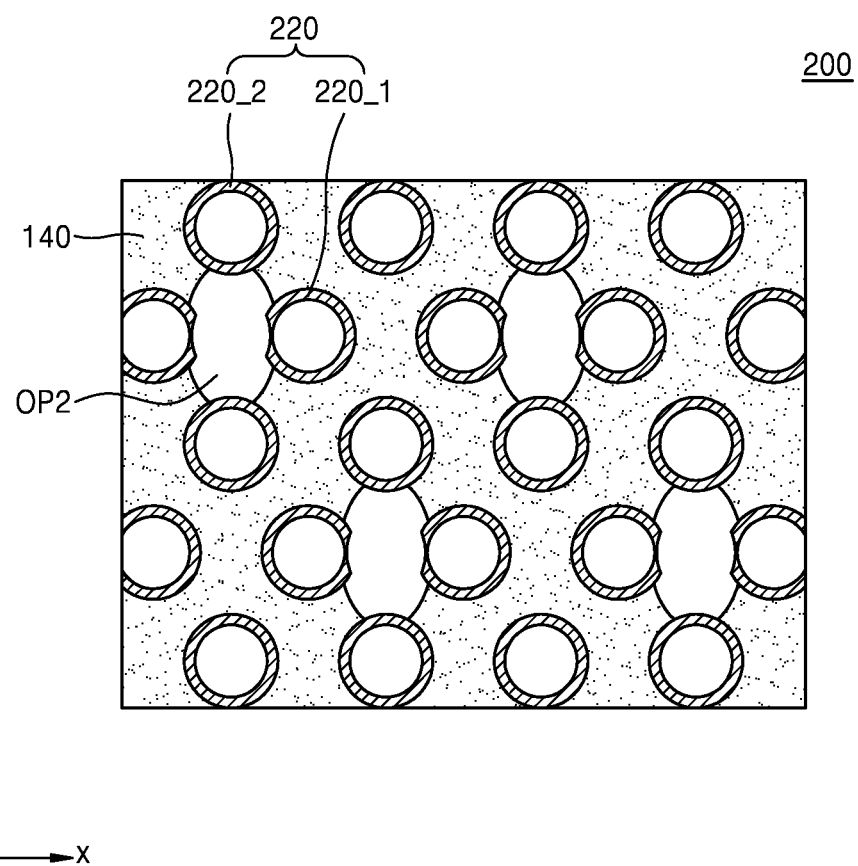
FIG. 2B is a plan view for explaining a second support structure pattern of a semiconductor device, according to an example embodiment.
Figure 2C:
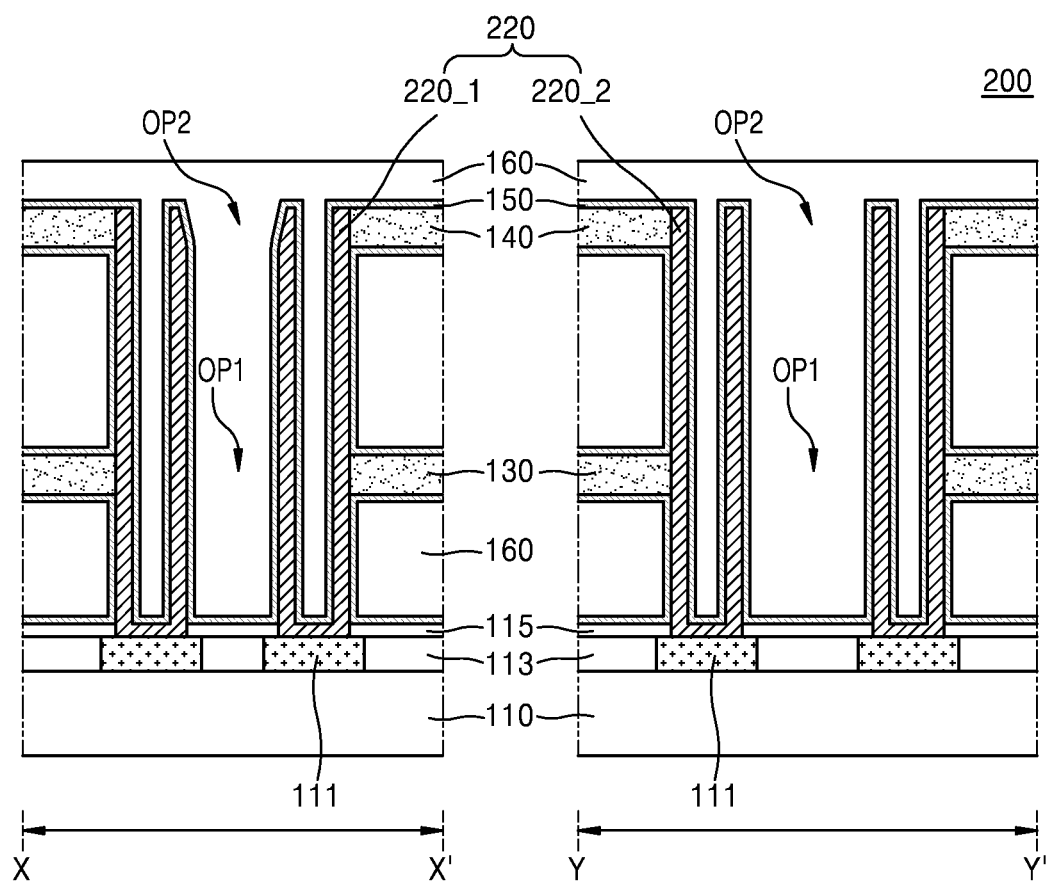
FIG. 2C is a cross-sectional view of a semiconductor device according to an example embodiment, taken along a line X-X' and Y-Y' of FIG. 2A.

FIG. 2A is a schematic perspective view of a semiconductor device 200 according to an example embodiment. FIG. 2B is a plan view for explaining the second support structure pattern 140 of the semiconductor device 200, according to an example embodiment. FIG. 2C is a cross-sectional view of the semiconductor device 200 according to an example embodiment, taken along a line X-X' and Y-Y' of FIG. 2A. FIG. 2C is a cross-sectional view additionally showing the dielectric layer 150 and the upper electrode 160 which are not shown in FIG. 2A. Like reference numerals in FIGS. 1A to 1C and FIGS. 2A to 2C denote like elements, and detailed descriptions of repeated elements are omitted for convenience.

Referring to FIGS. 2A to 2C, the semiconductor device 200 may include the substrate 110, the interlayer insulating layer 113, the etch stop layer 115, the plurality of lower electrodes 220, the first support structure pattern 130, and the second support structure pattern 140. The dielectric layer 150 and the upper electrode 160 may be on the lower electrodes 220, the first support structure pattern 130, and the second support structure pattern 140.

The lower electrodes 220 may have long and thin shapes extending in a direction perpendicular to the first direction (the x direction) and the second direction (the y direction) that are parallel to the main surface of the substrate 110, on the substrate 110. For example, the lower electrodes 220 may have honeycomb structures in which the lower electrodes 220 are arranged at respective vertices and a central point of a hexagon. The lower electrodes 220 may have cylinder-type structures.

The lower electrodes 220 may include first lower electrodes 220_1 arranged in the first direction (the x direction) and second lower electrodes 220_2 arranged in the second direction (the y direction), with respect to the plurality of first open portions OP1 and the plurality of second open portions OP2.

In an example embodiment, cross-sections of the second lower electrodes 220_2 are circular, but cross-sections of the first lower electrodes 220_1 may have circular shapes having side portions that are partially removed. Thus, cross-section areas of the first lower electrodes 220_1 may be smaller than those of the second lower electrodes 220_2. Also, widths of the first lower electrodes 220_1 in the first direction (the x direction) may be less than those of the first lower electrodes 220_1 in the second direction (the y direction). In addition, a minimum distance from a center of the cross-section of the first lower electrode 220_1 to the first open portion OP1 or the second open portion OP2 may be less than a minimum distance from a center of a cross-section of the second lower electrode 220_2 to the first open portion OP1 or the second open portion OP2.

When a capacitor including the lower electrodes 220 having cylinder-type structures is formed, the capacitor may have higher capacitance than a capacitor including only lower electrodes having pillar-type structures and having identical heights from the substrate 110. Also, compared with a capacitor including only lower electrodes having pillar-type structures, the capacitance of the capacitor including the lower electrodes 220 having cylinder-type structures may be identical to that of the capacitor including only the lower electrodes having pillar-type structures, even though the heights of the lower electrodes 220 decrease. Thus, a probability of collapse of the lower electrodes 220 may be reduced.

Since the semiconductor device 200 according to an example embodiment may include the first support structure pattern 130 including the first open portions OP1 and the second support structure pattern 140 including the second open portions OP2, the number of lower electrodes 220 that are exposed by the first open portions OP1 and the second open portions OP2 increases, and the lower electrodes 220 may be effectively supported in the subsequent processes. Therefore, the subsequent processes may be smoothly performed, and the performance of the capacitor may be improved so that the semiconductor device 200 may be improved.

Figure 3A:
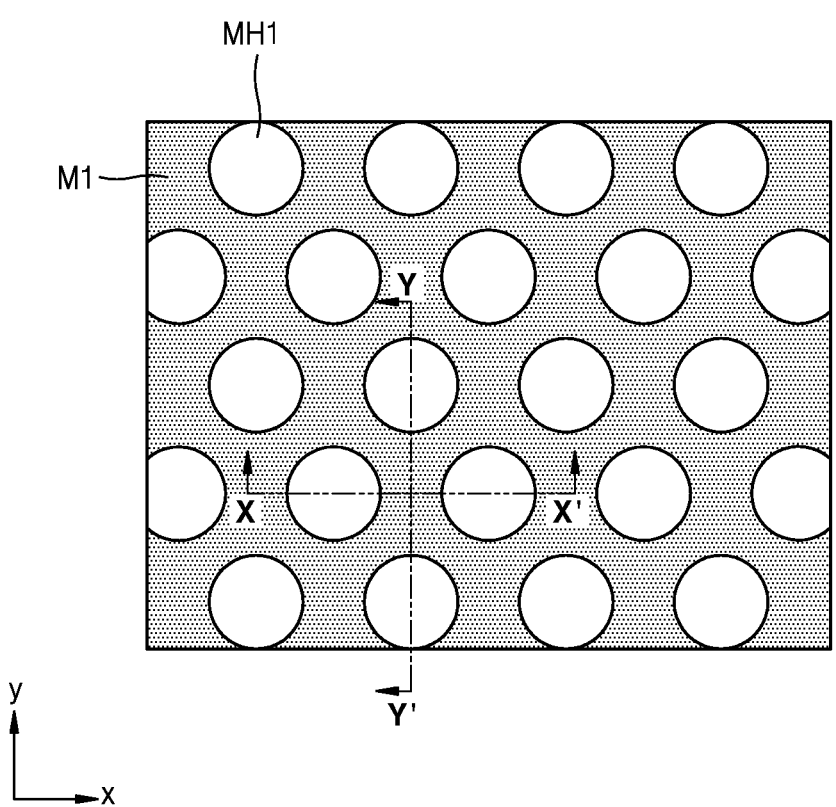
FIGS. 3A, 4A, 5A, . . . , 10A are top views for explaining processes of forming the semiconductor device of FIGS. 1A to 1C, according to example embodiments.
Figure 3B:
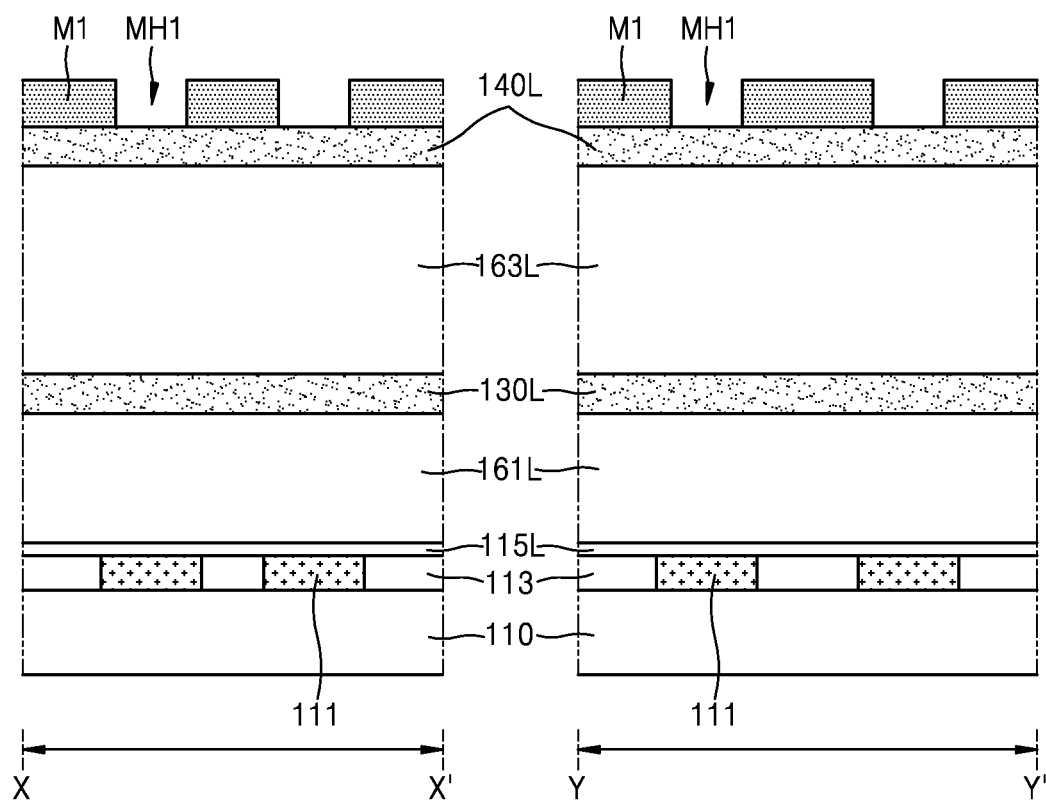
FIGS. 3B, 4B, 5B, . . . , 10B are cross-sectional views sequentially taken along a line X-X' and a line Y-Y' of FIGS. 3A, 4A, 5A, . . . , 10A.
Figure 4A:
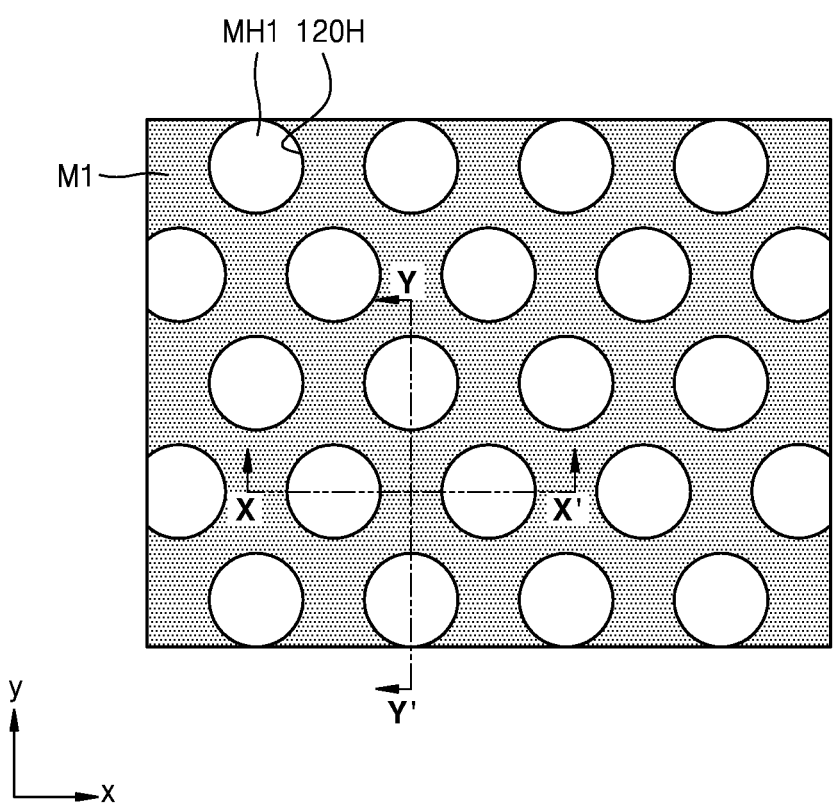
Figure 4B:
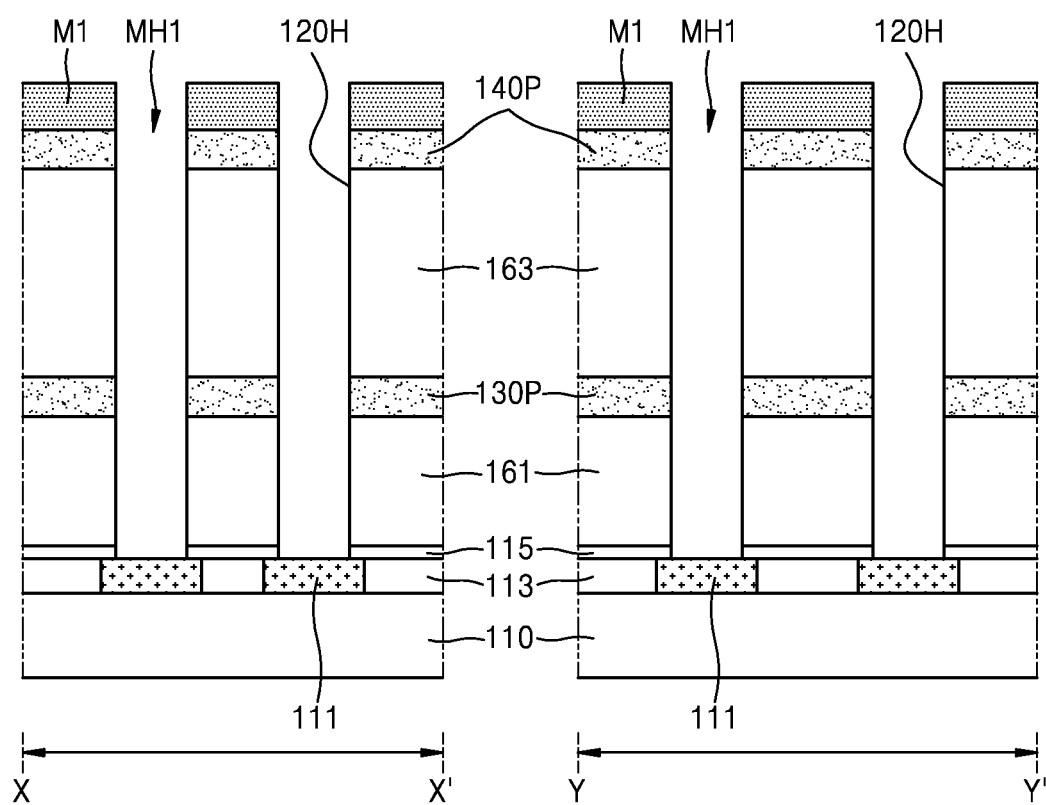
Figure 5A:
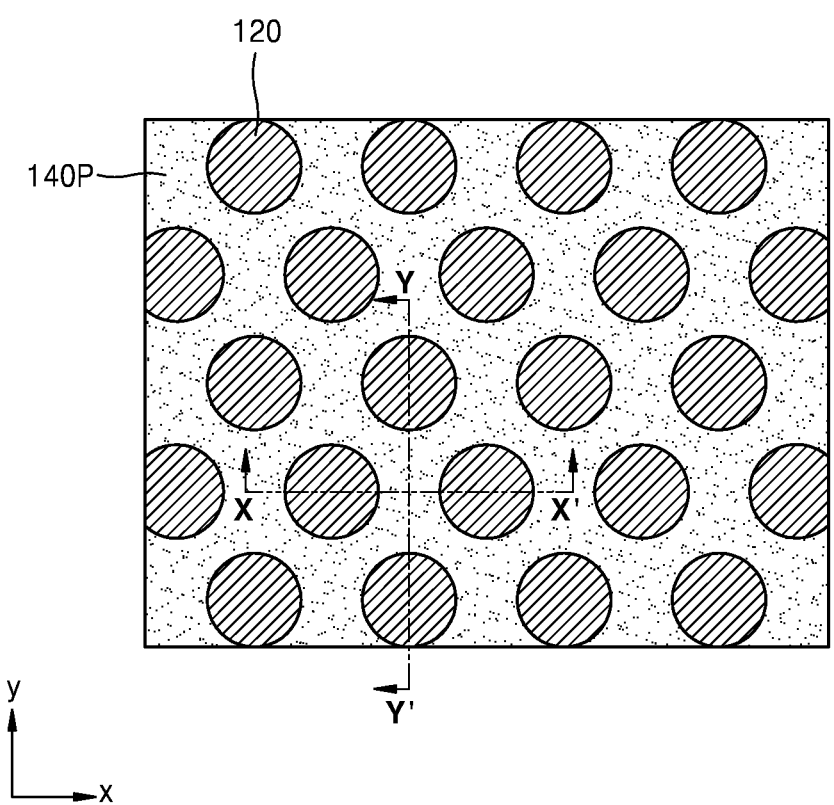
Figure 5B:
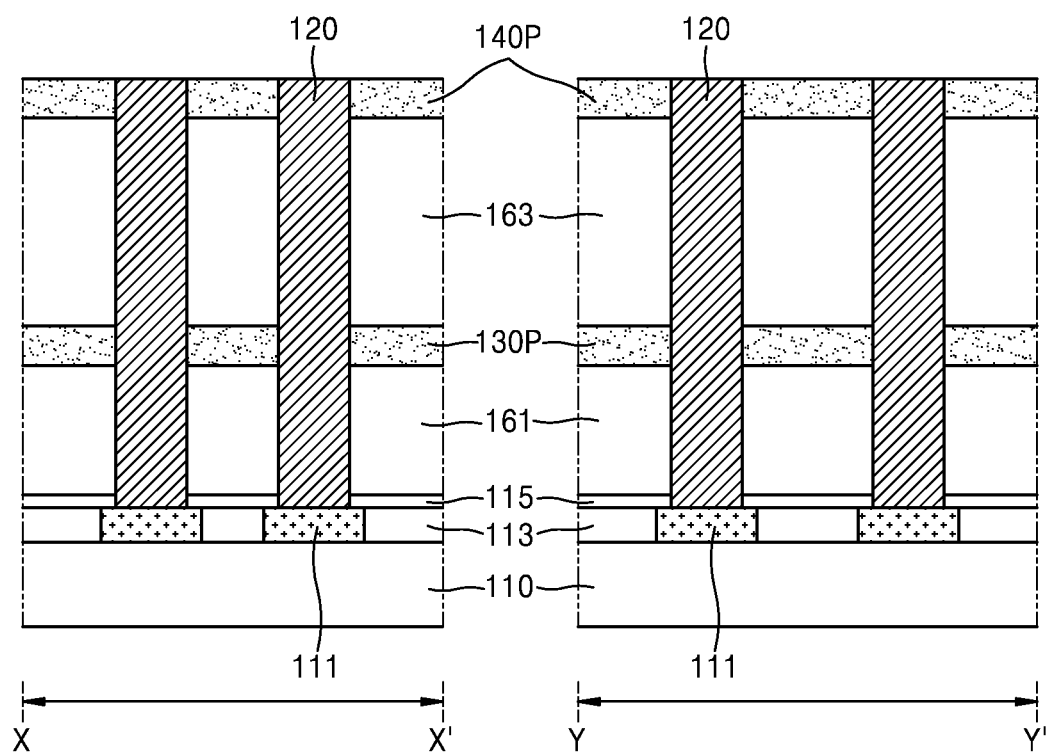

FIGS. 3A, 4A, 5A, . . . , and 10A are top views for explaining processes of forming the semiconductor device 100 of FIGS. 1A to 1C, according to embodiments. FIGS. 3B, 4B, 5B, . . . , 10B are cross-sectional views sequentially taken along a line X-X' and a line Y-Y' of FIGS. 3A, 4A, 5A, . . . , 10A. Like reference numerals in the drawings denote like elements, and for convenience, detailed descriptions of repeated elements are omitted.

Referring to FIGS. 3A and 3B, the plurality of contact plugs 111 are formed in the interlayer insulating layer 113 on the substrate 110. After an etch stop layer 115L is on the interlayer insulating layer 113 and the contact plugs 111, a first mold layer 161L is on the etch stop layer 115L.

The substrate 110 may include a semiconductor substrate and a plurality of semiconductor devices. A plurality of Gate lines and a plurality of bit lines may be on the semiconductor substrate, and the contact plugs 111 may be connected to source/drain electrodes of a metal oxide semiconductor (MOS) transistor included in the substrate 110.

The etch stop layer 115L may include a material having etching selectivity to the interlayer insulating layer 113 and the first mold layer 161L that are flat. For example, the etch stop layer 115L may be a silicon nitride layer or a silicon oxynitride layer. The first mold layer 161L may be an oxide layer. For example, the first mold layer 161L may be an oxide layer such as BPSG, SOD, PSG, LPTEOS, or PE-TEOS.

A first support layer 130L may be on the first mold layer 161L. The first support layer 130L may reduce a probability of (or, alternatively, prevent) the plurality of lower electrodes from collapsing during a subsequent wet etching process. For example, the first support layer 130L may be a nitride layer. A first buffer layer may be further formed between the first mold layer 161L and the first support layer 130L. In this case, the first buffer layer may include a material having etching selectivity to the first mold layer 161L and the first support layer 130L. The first buffer layer may be used as an etch stop layer in a process of etching the first support layer 130L and may reduce a probability of (or, alternatively, prevent damage) to the first mold layer 161L in the subsequent processes.

As a second mold layer 163L and a second support layer 140L may be sequentially formed on the first support layer 130L. The second mold layer 163L and the second support layer 140L may include the same materials as the first mold layer 161L and the first support layer 130L, respectively. However, example embodiments of the inventive concepts are not limited thereto. The second mold layer 163L and the second support layer 140L may include different materials. A second buffer layer may be further formed between the second mold layer 163L and the second support layer 140L.

However, example embodiments of the inventive concepts are not limited thereto. The first support layer 130L may not be formed on the substrate 110, and the second support layer 140L may only be formed on the substrate 110. Alternatively, only a third mold layer may additionally be on the second support layer 140L, or a third support layer may be additionally formed on the third mold layer.

A first mask pattern M1 may be formed on the second support layer 140L, the first mask pattern M1 including a plurality of first open holes MH1. The first open holes MH1 may be circular and may have honeycomb structures in which the first open holes MH1 are arranged at vertices and a central point of a hexagon on the substrate 110. The first mask pattern M1 may expose some portions of the second support layer 140L. When only the third mold layer is additionally formed on the second support layer 140L, the first mask pattern M1 may expose some portions of the third mold layer.

In an example embodiment, the first mask pattern M1 may include layers, and the layers may include a material having etching selectivity for the first mold layer 161L, the first support layer 130L, the second mold layer 163L, and the second support layer 140L.

Referring to FIGS. 3A, 3B, 4A, and 4B, the first mask pattern M1 including the first open holes MH1 is used as an etch mask, and the second support layer 140L, the second mold layer 163L, the first support layer 130L, and the first mold layer 161L are sequentially etched, thereby forming a plurality of lower electrode holes 120H. Upper surfaces of the contact plugs 111 may be exposed by the lower electrode holes 120H. Through the etching process, the second support layer 140L, the second mold layer 163L, the first support layer 130L, and the first mold layer 161L may respectively be a second preliminary support structure pattern 140P, a second mold pattern 163, a first preliminary support structure pattern 130P, and a first mold pattern 161. After the lower electrode holes 120H finally formed, the first mask pattern M1 may be removed.

In an example embodiment, a process of forming the lower electrode holes 120H may include exposing the second mold layer 163L by anisotropic plasma-etching the second support layer 140L, exposing the first support layer 130L by anisotropic plasma-etching the second mold layer 163L, exposing the first mold layer 161L by anisotropic plasma-etching the first support layer 130L, and anisotropic plasma-etching the first mold layer 161L. In this case, when the first support layer 130L is anisotropically etched after anisotropic plasma-etching the second mold layer 163L, an etching gas for etching the first support layer 130L may damage exposed side walls of the second mold layer 163L or may generate a polymer. Therefore, before anisotropically etching the first support layer 130L, a passivation layer may be further formed on the side walls of the second mold layer 163L.

The lower electrode holes 120H may be arranged in the first direction (the x direction) and the second direction (the y direction) that are parallel to the main surface of the substrate 110. For example, the lower electrode holes 120H may have honeycomb structures in which the lower electrode holes 120H are arranged at vertices and a central point of a hexagon on the substrate 110.

Referring to FIGS. 4A, 4B, 5A, and 5B, a conductive layer, which is to be used as a lower electrode, is deposited in the lower electrode holes 120H, and thus the plurality of lower electrodes 120 may be formed. Forming the lower electrodes 120 may include depositing the conductive layer in the lower electrode holes 120H and separating the lower electrodes 120 from each other by removing the conductive layer that is deposited on the second preliminary support structure pattern 140P by performing a planarization process.

Figure 11:
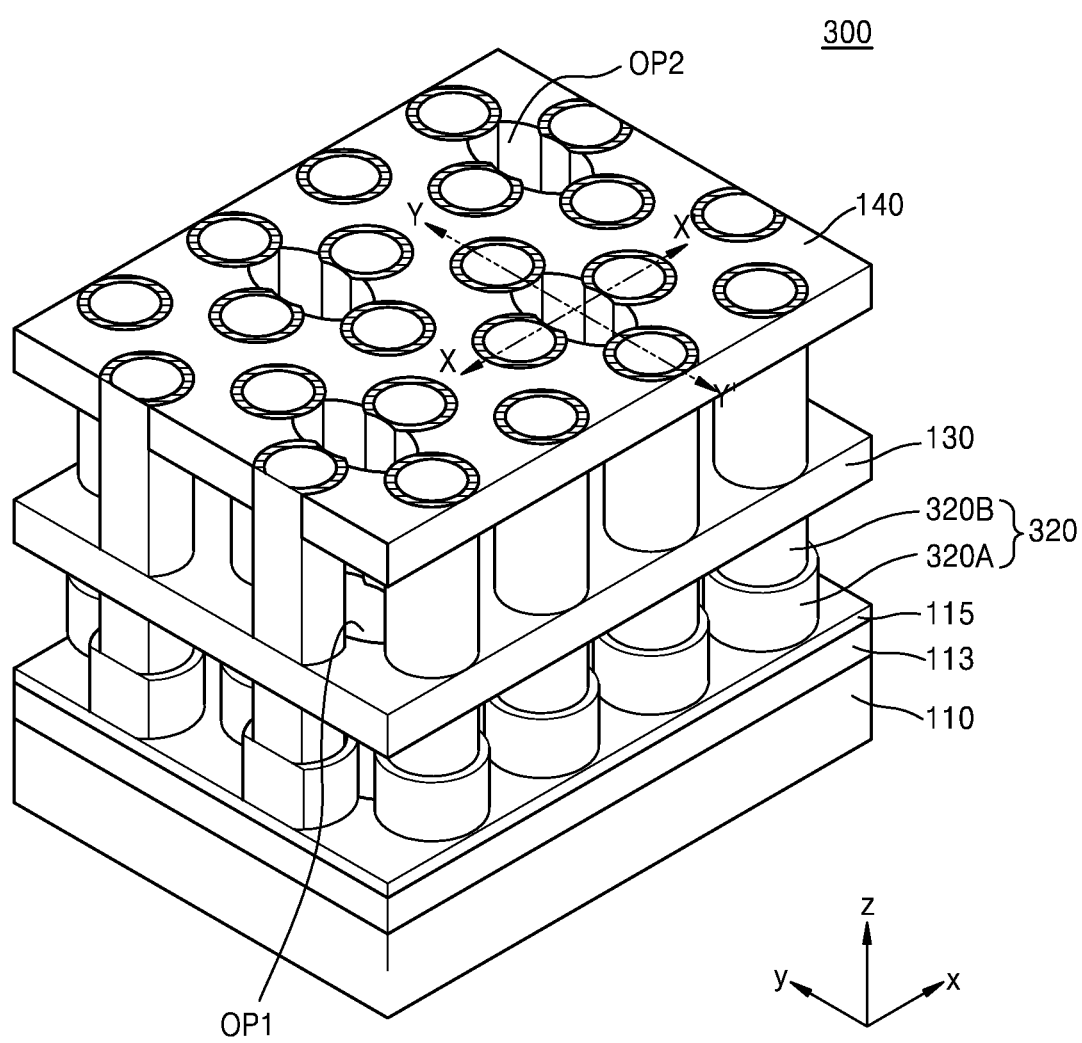
FIG. 11 is a schematic perspective view of a semiconductor device according to an example embodiment.

The lower electrodes 120 may be formed by depositing the conductive layer by chemical vapor deposition (CVD), physical vapor deposition (PVD), atomic layer deposition (ALD) in such a manner that step-coverage characteristics are great. The conductive layer may be deposited at a thickness that is equal to or greater than half of widths of the lower electrode holes 120H and thus may completely fill in the lower electrode holes 120H. Accordingly, as shown in the drawings, the lower electrodes 120 having pillar-type structures may be formed. According to another embodiment, the conductive layer may conformally cover inner walls of the lower electrode holes 120H at a thickness that is less than or equal to half of the widths of the lower electrode holes 120H. In this case, a sacrifice layer that fills the lower electrode holes 120H may be formed on the conductive layer after depositing the conductive layer, and as shown in FIG. 2A, the lower electrodes 220 having cylinder-type structures may be formed. Also, as shown in FIG. 11, a plurality of lower electrode structures 320 including both cylinder-type structures and pillar-type structures may be formed.

The conductive layer may include at least one of metallic materials, metal nitride, and metal silicide. For example, the conductive layer may include a refractory metal material such as Co, Ti, Ni, W, and Mo. As another example, the conductive layer may include metal nitride such as TiN, TiSiN, TiAlN, TaN, TaSiN, TaAlN, or WN. Also, the conductive layer may include at least one noble metal layer selected from the group consisting of Pt, Ru, and Ir.

After the conductive layer is deposited in the lower electrode holes 120H, a plasma treatment process and a heat treatment process for removing impurities, which are generated during the deposition of the conductive layer, may be additionally performed. During the plasma treatment process, nitrogen and oxygen plasma may be used. A planarization process performed after the deposition of the conductive layer may be, for example, a chemical mechanical polishing process or a dry etch back process.

Referring to FIGS. 5A, 5B, 6A, and 6B, a second mask pattern M2 including a plurality of second open holes MH2 may be formed on the lower electrodes 120 and the second preliminary support structure pattern 140P. For example, the second mask pattern M2 may include an oxide layer such as TEOS, BPSG, PSG, USG, SOD, or HDP. However, example embodiments of the inventive concepts are not limited thereto.

The second open holes MH2 may be circular or oval, and some of the lower electrodes 120 may be exposed by the second open holes MH2. For example, some portions of the first lower electrodes 120_1 that are adjacent to the second open holes MH2 in the first direction (the x direction) may be exposed by the second open holes MH2. The second lower electrodes 120_2 that are adjacent to the second open holes MH2 in the second direction (the y direction) may not be exposed by the second open holes MH2.

The second support structure pattern 140 including the plurality of second open portions OP2 may be formed by etching portions of the second preliminary support structure pattern 140P by using the second mask pattern M2 as an etch mask. A plasma etching process may be performed as an anisotropic etch process for forming the second support structure pattern 140. For example, when the second preliminary support structure pattern 140P includes a silicon nitride layer, a fluorocarbon (CxFy)-based etch gas or a hydrofluorocarbons (CxHyFz)-based etch gas may be used.

In this case, portions of the first lower electrodes 120_1 may be exposed by the second open holes MH2, and the exposed portions of the first lower electrodes 120_1 may be etched together with the portions of the second preliminary support structure pattern 140P and then removed. Thus, widths of the cross-sections of the first lower electrodes 120_1 in the first direction (the x direction) may be less than widths of the cross-sections of the first lower electrodes 120_1 in the second direction (the y direction). Also, minimum distances from the centers of the cross-sections of the first lower electrodes 120_1 to the first open portions OP1 or the second open portions OP2 may be less than minimum distances from the centers of the cross-sections of the second lower electrodes 120_2 to the first open portions OP1 or the second open portions OP2.

On the contrary, the second lower electrodes 120_2 may not be exposed by the second open holes MH2 and thus may not be etched, and side surfaces of the second lower electrodes 120_2 may be surrounded by the second support structure pattern 140.

Referring to FIGS. 6A, 6B, 7A, and 7B, the second mold pattern 163 may be completely removed by a wet etching process. For example, when the second mold pattern 163 includes oxide, the wet etching process may be performed by using a wet etchant. The wet etchant may contact the second mold pattern 163 through the second open portions OP2 of the second support structure pattern 140, and the second mold pattern 163 may be removed by the wet etchant.

For example, the wet etching process may be an LAL lift-off process using an LAL liquid including hydrogen fluoride (HF). The wet etchant may flow through the second open portions OP2 of the second support structure pattern 140 and thus may be used to etch and remove the second mold pattern 163. The second support structure pattern 140 may firmly fix the lower electrodes 120 to reduce a probability of (or, alternatively, prevent) the lower electrodes 120 from collapsing while the second mold pattern 163 is etched and removed.

While the second mold pattern 163 is etched and removed, the exposed portions of the second support structure pattern 140 may also be etched and removed. Thus, the cross-section areas of the second open portions OP2 of the second support structure pattern 140 may increase in a direction parallel to the main surface of the substrate 110. For example, when the second mold pattern 163 includes oxide, the second support structure pattern 140 may include nitride, but the etching selectivity ratio of the oxide of the second mold pattern 163 to the nitride of the second support structure pattern 140 is relatively low. Thus, areas of the second open portions OP2 may increase while the second mold pattern 163 is etched and removed. While the second mold pattern 163 is etched and removed, the lower electrodes 120 may not be etched and may be maintained, and in comparison with a rate of etching the second mold pattern 163 and the second support structure pattern 140, an etching rate of the lower electrodes 120 may be low. Therefore, the lower electrodes 120 may be rarely damaged.

Referring to FIGS. 7A, 7B, 8A, and 8B, the first support structure pattern 130 including the plurality of first open portions OP1 may be formed by etching portions of the first preliminary support structure pattern 130P by using the second mask pattern M2 as an etch mask. For example, an anisotropic etching process of forming the first support structure pattern 130 may be a plasma etching process that is identical to the process of forming the second support structure pattern 140. The first open portions OP1 are formed to allow the wet etchant to contact the first mold pattern 161 through the first open portions OP1 of the first support structure pattern 130, during a subsequent wet etching process.

After the first support structure pattern 130 including the first open portions OP1 is formed, the second mask pattern M2 may be removed by an ashing process.

Referring to FIGS. 8A, 8B, 9A, and 9B, the first mold pattern 161 may be completely removed by a wet etching process. The process of removing the first mold pattern 161 may be identical to the process of removing the second mold pattern 163. The wet etchant used during the wet etching process of removing the first mold pattern 163 may flow into the first mold pattern 161 through the first open portions OP1 of the first support structure pattern 130, and thus the first mold pattern 161 may be etched and removed. During the wet etching process, the first support structure pattern 130 and the second support structure pattern 140 may firmly fix the lower electrodes 120 to reduce a probability of (or, alternatively, prevent) the lower electrodes 120 from collapsing.

While the first mold pattern 161 is etched and removed, the exposed portions of the first support structure pattern 130 and the second support structure pattern 140 may also be etched and removed. Thus, the cross-section areas of the first open portions OP1 of the first support structure pattern 130 and the cross-section areas of the second open portions OP2 of the second support structure pattern 140 may increase in the direction parallel to the main surface of the substrate 110. As the cross-section areas of the first open portions OP1 and the second open portions OP2 gradually increase, the number of lower electrodes 120 that are exposed to the outside by the first open portions OP1 and the second open portions OP2, that is, that are open, may increase. In particular, the number of second lower electrodes 120_2 that are exposed by the first open portions OP1 and the second open portions OP2 may increase. In an example embodiment, all of the lower electrodes 120 may be exposed to the outside by the first open portions OP1 and the second open portions OP2. To expose the first lower electrodes 120_1 and the second lower electrodes 120_2, lengths of the first open portions OP1 and the second open portions OP2 in the second direction (the y direction) may be greater than in the first direction (the x direction).

According to the process of manufacturing the semiconductor device 100 according to an example embodiment, although gaps between the second open holes MH2 of the second mask pattern M2 are not narrow enough to open all of the lower electrodes 120, the areas of the first open portions OP1 and the second open portions OP2 may increase in the subsequent processes, and thus the lower electrodes 120 may be effectively exposed. Accordingly, dielectric materials and conductive materials flow into the first open portions OP1 and the second open portions OP2, and the dielectric layer and the upper electrode may be evenly formed on the lower electrodes 120, the first support structure pattern 130, and the second support structure pattern 140.

Figure 6B:
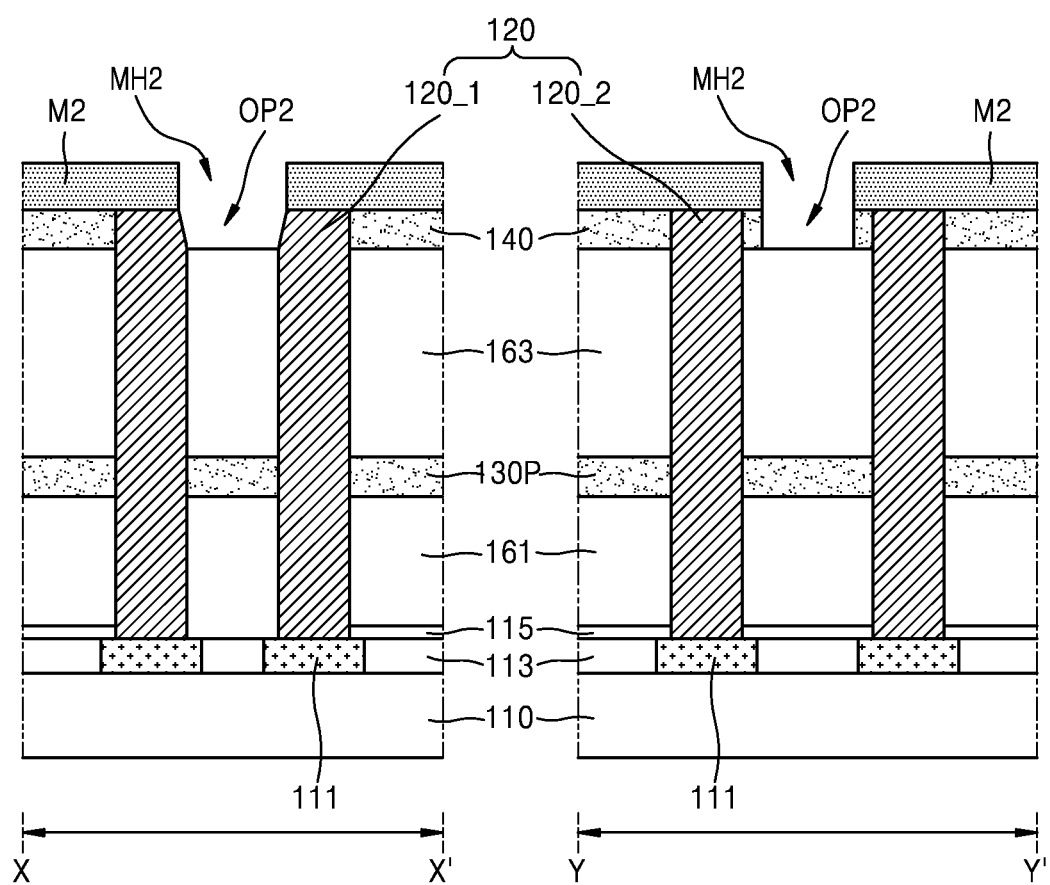
Figure 7A:
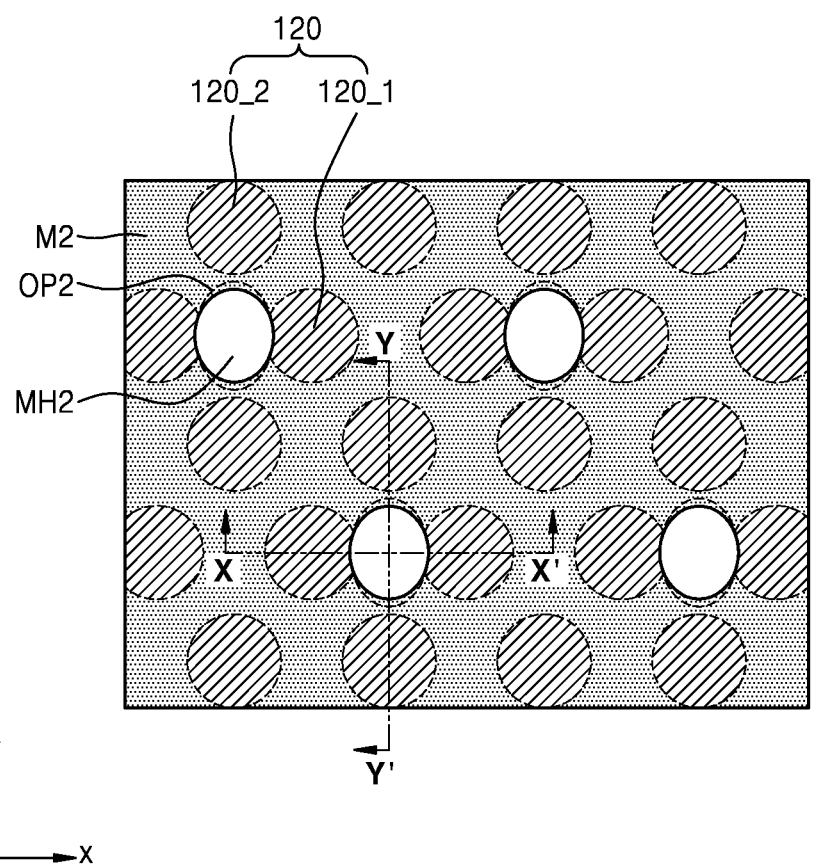
Figure 7B:
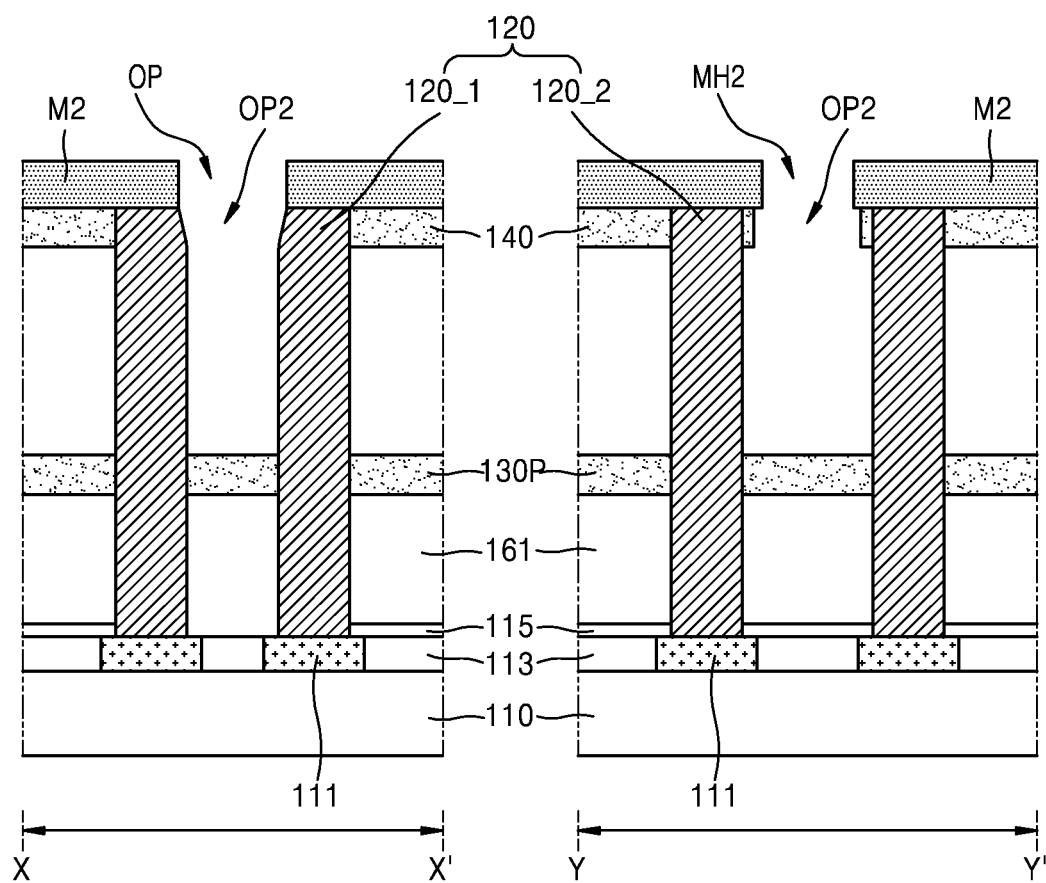
Figure 8A:
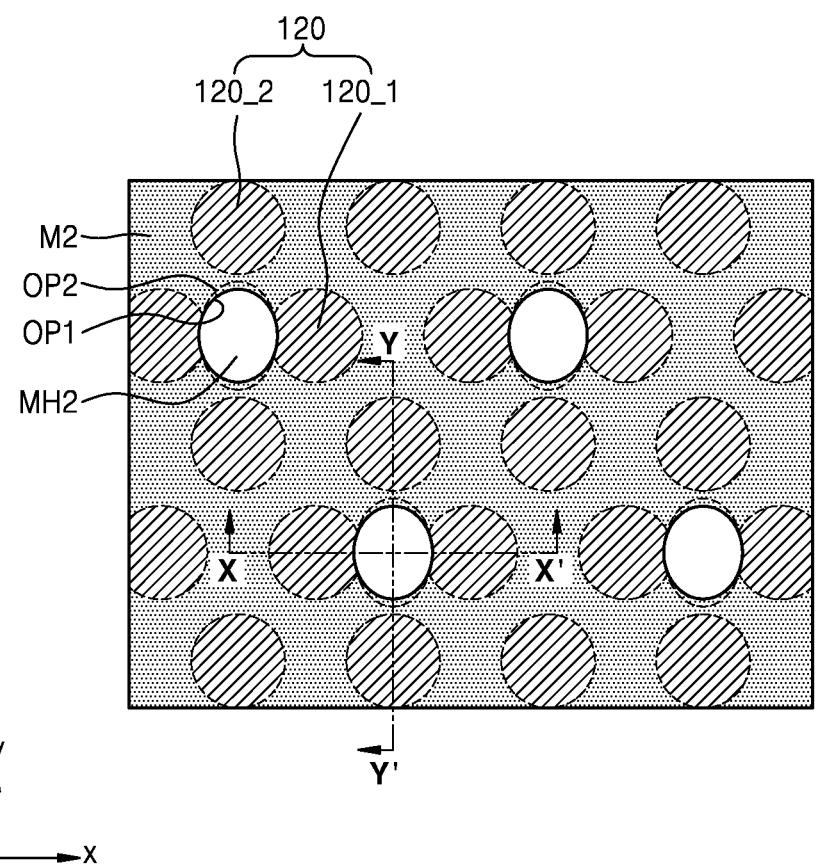
Figure 8B:
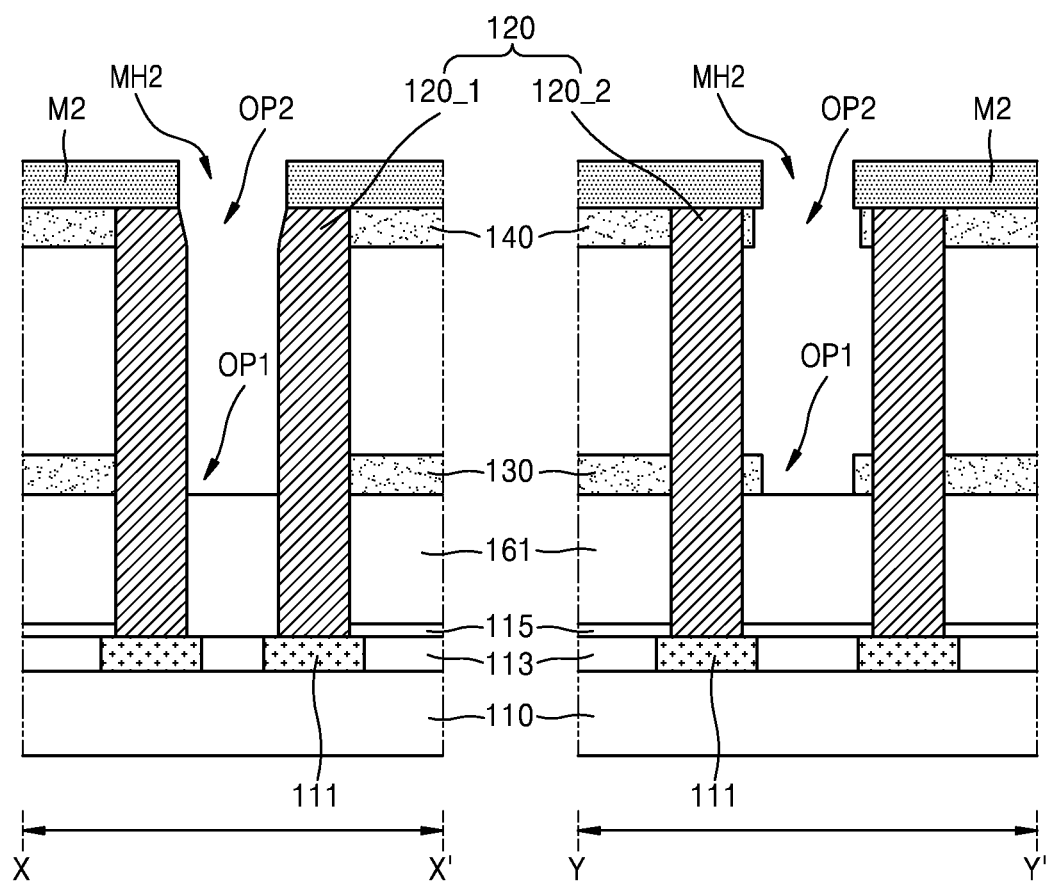

In this case, the cross-section areas of the first open portions OP1 of the first support structure pattern 130 may be less than the cross-section areas of the second open portions OP2 of the second support structure pattern 140. As shown in FIGS. 6B and 7B, the portions of the second support structure pattern 140 keep being etched while the second mold pattern 163 and the first mold pattern 161 are removed, and thus the cross-section areas of the second open portions OP2 may be relatively greater than those of the first open portions OP1.

The lower electrodes 120 may not be etched and maintained while the second mold pattern 163 and the first mold pattern 161 are etched and removed, or a rate of etching the lower electrodes 120 may be low in comparison with a rate of etching the first support structure pattern 130 and the second support structure pattern 140. Thus, the lower electrodes 120 may be rarely damaged while the first support structure pattern 130 and the second support structure pattern 140 are etched. Therefore, when viewed from the inner sides of the first open portions OP1 and the second open portions OP2, the side surfaces of the first open portions OP1 and the second open portions OP2 in the first direction (the x direction), in which the first open portions OP1 are exposed, may be convex from the central portions thereof, and the side surfaces of the first open portions OP1 and the second open portions OP2 in the second direction (the y direction), in which the second open portions OP2 are exposed, may be concave from the central portions.

Referring to FIGS. 9A, 9B, 10A, and 10B, the dielectric layer 150 may be on the lower electrodes 120. The dielectric layer 150 may be deposited by CVD, PVD, ALD, or the like in such a manner that step-coverage characteristics are great.

After the dielectric layer 150 is formed, the upper electrode 160 may be on the dielectric layer 150 as shown in FIGS. 1A to 1C. After the upper electrode 160 is formed, a plasma treatment process or a heat treatment process for removing impurities generated during the deposition of an upper conductive layer may be performed. During the plasma treatment process, nitrogen or hydrogen plasma may be used.

According to a method of manufacturing the semiconductor device 100 according to an example embodiment, when the first support structure pattern 130 and the second support structure pattern 140 for supporting the lower electrodes 120 are formed, the number of lower electrodes 120 that are exposed by the first open portions OP1 and the second open portions OP2 may increase. Therefore, according to the method of manufacturing the semiconductor device 100, the process of forming the dielectric layer 150 and the upper electrode 160 may be smoothly performed. That is, the semiconductor device 100 according to an example embodiment may include a capacitor with improved performance because a probability of collapse of the lower electrodes 120 may be reduced (or, alternatively, collapse may be prevented) due to the first support structure pattern 130 and the second support structure pattern 140 and the dielectric layer 150 and the upper electrodes 160 are evenly formed.

Referring to FIGS. 3A to 10A and FIGS. 3B to 10B, the processes of manufacturing the semiconductor device 100 including the plurality of lower electrodes 120 having pillar-type structures have been described. However, example embodiments of the inventive concepts are not limited thereto. As shown in FIGS. 2A to 2C, the processes of manufacturing the semiconductor device 200 including the plurality of lower electrodes 220 having cylinder-type structures may be identical to the processes of manufacturing the semiconductor device 100. Alternatively, as shown in FIG. 11, processes of manufacturing a semiconductor device 300 including the plurality of lower electrode structures 320 having both pillar-type structures and cylinder-type structures may be identical to the above-described processes. In addition, the processes of manufacturing the semiconductor device 100 shown in FIGS. 3A to 10A and FIGS. 3B to 10B is not limited to a case where the semiconductor device 100 includes the first support structure pattern 130 and the second support structure pattern 140. For example, the processes may be applied to a case where only the second support structure pattern 140 is formed and a case where a third support structure pattern is additionally formed.

FIG. 11 is a schematic perspective view of a semiconductor device according to an example embodiment. Like reference numerals in FIGS. 1A, 2A, and 11 denote like elements, and for convenience, repeated descriptions thereof will be omitted.

Referring to FIG. 11, the semiconductor device 300 may include the substrate 110, the interlayer insulating layer 113, the etch stop layer 115, the plurality of lower electrode structures 320, the first support structure pattern 130, and the second support structure pattern 140. A dielectric layer and an upper electrode may be on the lower electrode structures 320, the first support structure pattern 130, and the second support structure pattern 140.

On the substrate 110, the lower electrode structures 320 may have long and thin shapes extending in a direction perpendicular to the first direction (the x direction) and the second direction (the y direction) which are parallel to the main surface of the substrate 110. For example, the lower electrode structures 320 may have honeycomb structures arranged based on respective vertices and central points of hexagons. The lower electrode structures 320 may include lower electrodes 320A having pillar-type structures and lower electrodes 320B having cylinder-type structures.

In particular, the plurality of lower electrode structures 320 may have double-layer structures in which the plurality of lower electrodes 320A having pillar-type structures and the plurality of lower electrodes 320B having cylinder-type structures 320B are stacked. Lower sides of the lower electrodes 320A having pillar-type structures may be supported by the etch stop layer 115.

Widths of cross-sections of the lower electrodes 320A having pillar-type structures may be greater than widths of cross-sections of the lower electrodes 320B having cylinder-type structures. In some cases, the widths of the cross-sections of the lower electrodes 320A having pillar-type structures may be identical to or less than the widths of the cross-sections of the lower electrodes 320B having cylinder-type structures.

The lower electrodes 320B having cylinder-type structures may be stacked on the lower electrodes 320A having pillar-type structures in a manner that grooves are formed in upper surfaces of the lower electrodes 320A having pillar-type structures and lower sides of the lower electrodes 320B having cylinder-type structures are in the grooves. However, example embodiments of the inventive concepts are not limited thereto. Alternatively, the lower electrodes 320B having cylinder-type structures may be on the lower electrodes 320A having pillar-type structures without any groove. Heights of the lower electrodes 320A having pillar-type structures and heights of the lower electrodes 320B having cylinder-type structures may be equal to each other, or one of them may be lower than the other. The lower electrode structures 320 may include the same material as the lower electrodes 120 of FIG. 1A and the lower electrodes 220 of FIG. 2A.

When a capacitor including the lower electrode structures 320 including the lower electrodes 320A having pillar-type structures and the lower electrodes 320B having cylinder-type structures is formed, the capacitor may have greater capacitance than a capacitor only including lower electrodes having pillar-type structures and the same heights as the lower electrode structures 320 with respect to the main surface of the substrate 110. Also, compared to the capacitor including only lower electrodes having pillar-type structures, the capacitor including the lower electrode structures 320 may have the same capacitance as the capacitor including lower electrodes having pillar-type structures even though the heights of the lower electrode structures 320 are reduced such that a probability of collapse of the lower electrode structures 320 may be reduced (or, alternatively, collapse may be prevented.)

Figure 12:
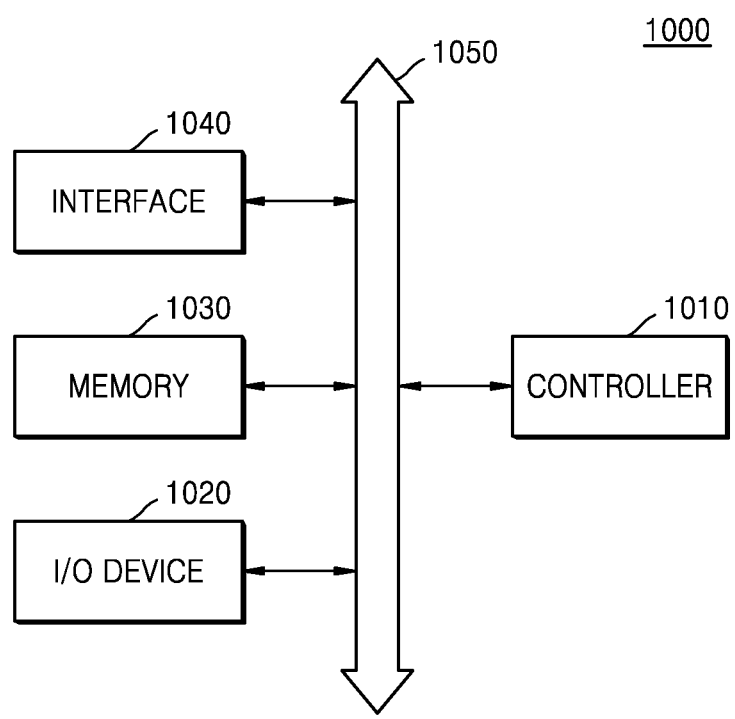
FIG. 12 is a block diagram of a system including a semiconductor device according to an example embodiment.

FIG. 12 is a block diagram of a system 1000 including a semiconductor device according to an example embodiment.

The system 1000 includes a controller 1010, an input/output (I/O) device 1020, a memory 1030, and an interface

1040. The system 1000 may be a mobile system or a system that receives or transmits information. In some embodiments, the mobile system may be a personal digital assistant (PDA), a portable computer, a web tablet, a wireless phone, a mobile phone, a digital music player, or a memory card. The controller 1010 is used to control programs executed in the system 1000 and may be a microprocessor, a digital signal processor, a microcontroller, or the like. The I/O device 1020 may be used to input or output data of the system 1000. The system 1000 may be connected to an external device, for example, a personal computer (PC) or a network, or may exchange data with the external device by using the I/O device 1020. The I/O device 1020 may be, for example, a keypad, a keyboard, or a display.

The memory 1030 may store code and/or data for operation of the controller 1010 or may store data processed by the controller 1010. The memory 1030 may include a semiconductor device including a fin-type field effect transistor (FET) according to an example embodiment. For example, the memory 1030 may include at least one of the semiconductor devices 100, 200, and 300 shown in FIGS. 1A, 2A, and 11.

The interface 1040 may be a data transmission path via which data is exchanged between the system 1000 and an external device. The controller 1010, the I/O device 1020, the memory 1030, and the interface 1040 may communicate with each other via a bus 1050. The system 1000 may be included in a mobile phone, an MP3 player, a navigation device, a portable multimedia player (PMP), a solid state disk (SSD), or household appliances.

While example embodiments of the inventive concepts have been particularly shown and described with reference to some example embodiments thereof, it will be understood that various changes in form and details may be made therein without departing from the spirit and scope of the following claims.

What is claimed is:

1. A semiconductor device comprising:
   a plurality of lower electrodes arranged on a substrate in a first direction and a second direction, the first direction being parallel to a main surface of the substrate, and the second direction being parallel to the main surface of the substrate and perpendicular to the first direction, the plurality of lower electrodes including columns of a plurality of first lower electrodes and columns of a plurality of second lower electrodes alternately arranged on the substrate in the first direction such that each of the columns of the plurality of second lower electrodes are offset from each of the columns of the plurality of first lower electrodes in the second direction; and
   a support structure pattern configured to connect the plurality of lower electrodes to each other, and to support the plurality of lower electrodes on the substrate, the support structure pattern having a plurality of open portions therein, the plurality of open portions having a shape that extends further in the second direction than in the first direction, wherein
   the plurality of first lower electrodes are arranged side by side in the first direction with the plurality of open portions,
   the plurality of second lower electrodes are arranged side by side in the second direction with the plurality of open portions,
   at a height at which the plurality of open portions are formed from the substrate, an area of a cross-section of one of the plurality of first lower electrodes is smaller than an area of a cross-section of one of the plurality of second lower electrodes, and
   the plurality of open portions are convex in the first direction and correspond to the cross-sections of the first lower electrodes and are concave in the second direction and correspond to the cross-sections of the second lower electrodes when viewed from inner sides of the plurality of open portions.

2. The semiconductor device of claim 1, wherein the support structure pattern comprises:
   a first support structure pattern including a plurality of first open portions; and
   a second support structure pattern including a plurality of second open portions, wherein
   the first support structure pattern is at a lower level than the second support structure pattern with respect to the main surface of the substrate.

3. The semiconductor device of claim 2, wherein a cross-section area of each of the plurality of first open portions is smaller than a cross-section area of each of the plurality of second open portions.

4. The semiconductor device of claim 2, wherein the plurality of first open portions and the plurality of second open portions overlap one another in a direction perpendicular to the main surface of the substrate.

5. The semiconductor device of claim 1, wherein
   each of the plurality of open portions exposes portions of four of the plurality of lower electrodes, and
   the plurality of open portions expose portions of the plurality of lower electrodes in the first direction and the second direction.

6. The semiconductor device of claim 1, wherein the plurality of open portions have a honeycomb structure such that the plurality of open portions are at vertices of a hexagon on the substrate and at a central point of the hexagon.

7. The semiconductor device of claim 1, wherein the plurality of open portions expose all of the plurality of lower electrodes.

8. The semiconductor device of claim 1, wherein the plurality of lower electrodes comprise:
   a plurality of lower electrodes having pillar-type structures.

9. A semiconductor device comprising:
   a plurality of lower electrodes arranged on a substrate in a first direction and a second direction, the first direction being parallel to a main surface of the substrate, and the second direction being parallel to the main surface of the substrate and perpendicular to the first direction, and the plurality of lower electrodes including columns of a plurality of first lower electrodes and columns of a plurality of second lower electrodes alternately arranged on the substrate in the first direction such that each of the columns of the plurality of second lower electrodes are offset from each of the columns of the plurality of first lower electrodes in the second direction; and
   a support structure pattern configured to connect the plurality of lower electrodes to each other, and to support the plurality of lower electrodes on the substrate, the support structure pattern having a plurality of open portions therein, each of the plurality of open portions exposing two of the plurality of first lower electrodes and exposing two of the plurality of second lower electrodes, wherein the plurality of first lower electrodes are arranged side by side in the first direction with the plurality of open portions, the plurality of second lower electrodes are arranged side by side in the second direction with the plurality of open portions, at a height at which the plurality of open portions are formed from the substrate, an area of a cross-section of one of the plurality of first lower electrodes is smaller than an area of a cross-section of one of the plurality of second lower electrodes.

10. The semiconductor device of claim 9, wherein the plurality of lower electrodes comprise:

a plurality of lower electrodes having cylinder-type structures.

11. The semiconductor device of claim 9, wherein minimum distances from central portions of the cross-sections of the plurality of first lower electrodes to the plurality of open portions are less than minimum distances from central portions of the cross-sections of the plurality of second lower electrodes to the plurality of open portions.

12. The semiconductor device of claim 9, wherein the plurality of open portions are arranged in the first direction and the second direction.

13. The semiconductor device of claim 9, wherein each of the plurality of open portions has a shape that is longer in the second direction than in the first direction.

14. The semiconductor device of claim 9, wherein widths of the cross-sections of the plurality of first lower electrodes in the first direction are less than widths of the cross-sections of the plurality of first lower electrodes in the second direction.

15. A semiconductor device comprising:

a support structure pattern configured to support a plurality of lower electrodes on a substrate, the plurality of lower electrodes including columns of a plurality of first lower electrodes and columns of a plurality of second lower electrodes alternately arranged on the substrate in a first direction such that each of the columns of the plurality of second lower electrodes are offset from each of the columns of the plurality of first lower electrodes in a second direction perpendicular to the first direction, the support structure pattern including a first support structure pattern and a second support structure pattern with the plurality of lower electrodes therebetween, the first support structure pattern and the second support structure pattern having a plurality of first openings and a plurality of second openings therein, respectively, the plurality of first openings being aligned with the plurality of second openings such that respective ones of the plurality of first openings and respective ones of the plurality of second openings extend in a direction perpendicular to the substrate between four of the plurality of lower electrodes while being bounded by the four of the plurality of lower electrodes such that the respective ones of the plurality of second openings do not extend beyond the four of the plurality of lower electrodes with two of the four of the plurality of lower electrodes being associated with one of the columns of the plurality of first lower electrodes and two of the four of the plurality of lower electrodes being associated with one of the columns of the plurality of second lower electrodes offset from the one of the columns of the plurality of first lower electrodes, wherein the first support structure pattern is at a lower level than the second support structure pattern with respect to the substrate, a cross sectional area of each of the plurality of first openings in a direction parallel to the substrate is smaller than a cross sectional area of each of the plurality of second openings in the direction parallel to the substrate, and the plurality of second openings are convex in the first direction and correspond to cross-sections of the plurality of lower electrodes and are concave in the second direction and correspond to cross-sections of the plurality of lower electrodes when viewed from inner sides of the plurality of second openings.

16. The semiconductor device of claim 15, wherein the plurality of first openings and the plurality of second openings have a honeycomb structure such that the plurality of first openings and the plurality of second openings are at vertices of a hexagon on the substrate and at a central point of the hexagon.

17. The semiconductor device of claim 15, wherein corresponding ones the plurality of first openings and the plurality of second openings each expose an exposed portion of a same two of the plurality of first lower electrodes and an exposed portion of a same two of the plurality of second lower electrodes.

18. The semiconductor device of claim 17, further comprising:

a dielectric layer on the plurality of first lower electrodes and on the plurality of the second lower electrodes such that a thickness of the dielectric layer is uniform over respective ones of the plurality of first lower electrodes and respective ones of the plurality of second lower electrodes.

* * * * *